(12) United States Patent
Kim et al.

(10) Patent No.: US 12,711,923 B2
(45) Date of Patent: Aug. 18, 2026

(54) DRIVING CIRCUIT AND ELECTRONIC DEVICE

(71) Applicant: SAMSUNG DISPLAY CO., LTD., Yongin-si (KR)

(72) Inventors: Minjoo Kim, Yongin-si (KR); Nackhyeon Keum, Yongin-si (KR); Jeonghun Bang, Yongin-si (KR); Kwangsoon Park, Yongin-si (KR); Kyunghoon Kim, Yongin-si (KR); Eseudeo Yun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/059,704

(22) Filed: Feb. 21, 2025

(65) Prior Publication Data

US 2025/0273166 A1 Aug. 28, 2025

(30) Foreign Application Priority Data

Feb. 23, 2024 (KR) ........................ 10-2024-0026260
Aug. 7, 2024 (KR) ........................ 10-2024-0105708

(51) Int. Cl.
*G09G 3/3266* (2016.01)
*G09G 3/32* (2016.01)
(Continued)

(52) U.S. Cl.
CPC ............. *G09G 3/3266* (2013.01); *G09G 3/32* (2013.01); *G09G 3/3674* (2013.01);
(Continued)

(58) Field of Classification Search
CPC ......... G09G 2310/0286; G09G 3/3266; G09G 2310/08; G09G 3/20; G09G 3/3677; G09G 2300/0426; G09G 2310/061; G09G 2310/0267; G09G 3/3674; G09G 2310/0264; G11C 19/287
See application file for complete search history.

(56) References Cited

U.S. PATENT DOCUMENTS 7,999,579 B2 8/2011 Lee et al.
2002/0105512 A1 8/2002 Kwon
(Continued)

FOREIGN PATENT DOCUMENTS

CN 115083332 A 9/2022
KR 0363095 B1 12/2002
(Continued)

*Primary Examiner* — Dismery Mercedes
(74) *Attorney, Agent, or Firm* — F. CHAU & ASSOCIATES, LLC

(57) ABSTRACT

A driving circuit includes a stage including a first transistor connected to a first terminal receiving a start signal, and to a first node, a second transistor connected between the first node and a second node, an inverter connected between a third terminal, receiving a second voltage, and the second terminal, the inverter being configured to control a voltage of a third node to be a voltage obtained by inverting a voltage level of the first node or the second node, a pull-down transistor including a gate connected to the second node, a pull-up transistor including a gate connected to the third node, and a reset circuit configured to reset the second node or the third node.

16 Claims, 19 Drawing Sheets

(51) Int. Cl.
*G09G 3/36* (2006.01)
*G11C 19/28* (2006.01)

(52) U.S. Cl.
CPC ......... *G09G 3/3677* (2013.01); *G11C 19/287* (2013.01); *G09G 2310/0264* (2013.01); *G09G 2310/0267* (2013.01); *G09G 2310/0286* (2013.01); *G09G 2310/061* (2013.01); *G09G 2310/08* (2013.01)

(56) References Cited

U.S. PATENT DOCUMENTS

| | | | | |
|---|---|---|---|---|
| 2012/0206432 | A1 | 8/2012 | Kang et al. | |
| 2015/0029083 | A1* | 1/2015 | He | G09G 3/3648 345/100 |
| 2015/0206490 | A1* | 7/2015 | Lim | G09G 3/3677 327/109 |
| 2017/0140697 | A1 | 5/2017 | In et al. | |
| 2020/0320945 | A1* | 10/2020 | Du | G09G 3/3266 |
| 2021/0118347 | A1* | 4/2021 | Wang | G09G 3/3266 |
| 2021/0241673 | A1* | 8/2021 | Liu | G09G 3/2092 |
| 2021/0327339 | A1* | 10/2021 | Feng | G09G 3/2092 |
| 2022/0172659 | A1* | 6/2022 | Park | G09G 3/20 |
| 2022/0398968 | A1* | 12/2022 | Wang | G09G 3/2096 |
| 2025/0252926 | A1* | 8/2025 | Kim | G09G 3/3233 |

FOREIGN PATENT DOCUMENTS

| | | | |
|---|---|---|---|
| KR | 10-0892337 | B1 | 4/2009 |
| KR | 10-2012-0091880 | A | 8/2012 |
| KR | 2409970 | B1 | 6/2022 |

* cited by examiner

DRIVING CIRCUIT AND ELECTRONIC DEVICE

CROSS-REFERENCE TO RELATED APPLICATION

This patent application claims priority under 35 U.S.C. § 119 to Korean Patent Application Nos. 10-2024-0026260 and 10-2024-0105708, respectively filed on Feb. 23, 2024 and Aug. 7, 2024, in the Korean Intellectual Property Office, the disclosures of which are incorporated by reference in their entireties herein.

1. TECHNICAL FIELD

The present disclosure is directed to a driving circuit, and more particularly, to a driving circuit capable of outputting a gate signal, and a display device and an electronic device including the driving circuit.

2. DISCUSSION OF RELATED ART

Currently, a display apparatus are thin and lightweight electronic visual display apparatus commonly used in various devices, such as televisions, computer monitors, smartphones, and tablets. Unlike older cathode ray tube (CRT) displays, which are bulky and rely on electron beams to illuminate phosphor screens, the display apparatus using modern technologies enable compact form factors and high image quality. Examples of the display apparatus using modern technologies include liquid crystal displays (LCDs), organic light emitting diode (OLED) displays, and MicroLED displays.

A display apparatus may include a pixel area including a plurality of pixels, a gate driving circuit, a data driving circuit, and a controller. The gate driving circuit includes stages connected to gate lines, and the stages supply gate signals through the gate lines connected thereto in response to signals from the controller. Each stage includes several transistors. However, if one of the internal nodes of the stage remains at a lower level for an extended period, it can lead to stress-related issues for certain transistors in the stage. The stress-related issues may include threshold voltage shift, increased leakage current, or decreased drive current, which can collectively reduce the lifespan and performance of the display apparatus and increase power consumption.

SUMMARY

One or more embodiments include a driving circuit capable of stably outputting a gate signal with low power, and a display device and an electronic device including the driving circuit.

According to an embodiment, a driving circuit includes a plurality of stages. Each of the plurality of stages includes a first through seventh transistors. The first transistor is connected to a first terminal receiving a start signal, and to a first node, the first transistor including a gate connected to a clock terminal receiving a clock signal. The second transistor is connected between the first node and a second node, and includes a gate connected to a second terminal receiving a first voltage. The third transistor is connected between a third terminal receiving a second voltage higher than the first voltage, and a third node, the third transistor including a gate connected to the first node. The fourth transistor is connected between the third node and the second terminal, and includes a gate connected to the second node. The fifth transistor is connected between an output terminal and the second terminal, and includes a gate connected to the second node. The sixth transistor is connected between the third terminal and the output terminal, and includes a gate connected to the third node. The seventh transistor is connected between the third node and the second terminal, and includes a gate connected to a reset terminal.

In an embodiment, from a time when the first voltage and the second voltage are input to a time when the clock signal is input, a reset signal of a gate-on voltage may be input to the reset terminal of each of the plurality of stages, and the third nodes of the plurality of stages may be simultaneously reset to the first voltage.

In an embodiment, for a certain period of time before the time when the first voltage and the second voltage are input, 0 V may be input to the first terminal, the second terminal, the third terminal, and the reset terminal of each of the plurality of stages, and the third nodes of the plurality of stages may be simultaneously discharged to 0 V.

In an embodiment, when the start signal is input after the time when the clock signal is input, output signals may be sequentially output from the output terminals of the plurality of stages, and a reset signal of a gate-off voltage may be input to the reset terminal of each of the plurality of stages from the time when the clock signal is input.

In an embodiment, the third transistor may be a P-channel transistor, and the fourth transistor may be an N-channel transistor.

In an embodiment, the fourth transistor may be an N-channel transistor, and remaining transistors other than the fourth transistor may be P-channel transistors.

In an embodiment, each of the plurality of stages may further include a first capacitor connected between the second node and the output terminal, and a second capacitor connected between the third terminal and the third node.

In an embodiment, each of the plurality of stages may further include an eighth transistor connected between the third terminal and the first node, and including a gate connected to the reset terminal, wherein the seventh transistor and the eighth transistor are N-channel transistors.

In an embodiment, each of the plurality of stages may further include an eighth transistor connected between the third terminal and the first node, and including a gate connected to a second reset terminal, wherein the seventh transistor is a P-channel transistor and the eighth transistor is an N-channel transistor, wherein a timing at which a first reset signal input to the reset terminal connected to the seventh transistor is a gate-on voltage and a timing at which a second reset signal input to the second reset terminal connected to the eighth transistor is a gate-on voltage are the same.

According to an embodiment, a driving circuit includes a plurality of stages. Each of the plurality of stages includes first through eighth transistors. The first transistor is connected to a first terminal receiving a start signal, and to a first node, the first transistor including a gate connected to a clock terminal receiving a clock signal. The second transistor is connected between the first node and a second node, and includes a gate connected to a second terminal receiving a first voltage. The third transistor is connected between a third terminal receiving a second voltage higher than the first voltage, and a third node. The third transistor includes a gate connected to the first node. The fourth transistor is connected between the third node and the second terminal, and includes a gate connected to the second node. The fifth transistor is connected between an output terminal and the second terminal, and includes a gate connected to the second node. The sixth transistor is connected between the third terminal and the output terminal, and includes a gate connected to the third node. The seventh transistor is connected between the third node and a fourth terminal receiving a third voltage lower than the first voltage. The seventh transistor includes a gate connected to a reset terminal. The eighth transistor is connected between the third terminal and the first node, and includes a gate connected to the reset terminal.

In an embodiment, the seventh transistor and the eighth transistor may be N-channel transistors.

In an embodiment, from a time when the first voltage, the second voltage, and the third voltage are input to a time when the clock signal is input, a reset signal of a gate-on voltage may be input to the reset terminal of each of the plurality of stages, and the third nodes of the plurality of stages may be simultaneously reset to the first voltage.

In an embodiment, for a certain period of time before the time when the first voltage, the second voltage, and the third voltage are input, 0 V may be input to the first terminal, the second terminal, the third terminal, and the reset terminal of each of the plurality of stages, and the third nodes of the plurality of stages may be simultaneously discharged to 0 V.

In an embodiment, when the start signal is input after the time when the clock signal is input, output signals may be sequentially output from the output terminals of the plurality of stages, and a reset signal of a gate-off voltage may be input to the reset terminal of each of the plurality of stages from the time when the clock signal is input.

In an embodiment, the third transistor may be a P-channel transistor, and the fourth transistor may be an N-channel transistor.

In an embodiment, each of the plurality of stages may further include a first capacitor connected between the second node and the output terminal, and a second capacitor connected between the third terminal and the third node.

According an embodiment, an electronic device includes a controller, a power supply circuit, and a driving circuit. The controller is configured to output a plurality of clock signals. The power supply circuit is configured to output a plurality of voltages. The driving circuit is configured to output a gate signal based on the plurality of clock signals and the plurality of voltages. The driving circuit includes a plurality of stages. Each of the plurality of stages includes a first transistor, a second transistor, an inverter, a pull-down transistor, a pull-up transistor and a reset transistor. The first transistor is connected to a first terminal receiving a start signal, and to a first node, the first transistor including a gate connected to a clock terminal receiving one of the clock signals. The second transistor is connected between the first node and a second node, and includes a gate connected to a second terminal receiving a first voltage among the voltages. The inverter is connected between a third terminal receiving a second voltage among the voltages, and the second terminal. The inverter is configured to control a voltage of the third node to be a voltage obtained by inverting a voltage level of the first node or the second node. The pull-down transistor is connected between an output terminal and the second terminal, and includes a gate connected to the second node. The pull-up transistor is connected between the third terminal and the output terminal, and includes a gate connected to the third node. The reset circuit is configured to reset the second node or the third node.

In an embodiment, the reset circuit may include a third transistor connected between the third node and the second terminal, and including a gate connected to a reset terminal.

The reset circuit may include a third transistor connected between the third node and the second terminal, and including a gate connected to a reset terminal, and a fourth transistor connected between the third terminal and the first node, and including a gate connected to the reset terminal, wherein the third transistor and the fourth transistor are N-channel transistors.

In an embodiment, the reset circuit may include a third transistor connected between the third node and a fourth terminal to which a third voltage is input, the third transistor including a gate connected to a reset terminal, and a fourth transistor connected between the third terminal and the first node, and including a gate connected to the reset terminal, wherein the third transistor and the fourth transistor are N-channel transistors.

In an embodiment, the reset circuit may include a third transistor connected between the third node and the second terminal, and including a gate connected to a first reset terminal, and a fourth transistor connected between the third terminal and the first node, and including a gate connected to a second reset terminal, wherein the third transistor is a P-channel transistor, and the fourth transistor is an N-channel transistor, wherein a timing at which a first reset signal input to the first reset terminal of the third transistor is a gate-on voltage and a timing at which a second reset signal input to the second reset terminal of the fourth transistor is a gate-on voltage are the same.

According to an embodiment, an electronic device includes a controller configured to receive an on-operation signal from a processor and output a reset signal based on the on-operation signal, and a driving circuit including a stage configured to receive the reset signal and reset a control node. The stage includes a first transistor, a second transistor, an inverter, a pull-down transistor, a pull-up transistor and a reset transistor. The first transistor is connected to a first terminal receiving a start signal, and to a first node, the first transistor including a gate connected to a clock terminal receiving a clock signal. The second transistor is connected between the first node and a second node, and includes a gate connected to a second terminal receiving a first voltage. The inverter is connected between a third terminal receiving a second voltage, and the second terminal. The inverter is configured to control a voltage of the control node to be a voltage obtained by inverting a voltage level of the first node or the second node. The pull-down transistor is connected between an output terminal and the second terminal, and includes a gate connected to the second node. The pull-up transistor is connected between the third terminal and the output terminal, and includes a gate connected to the control node. The reset transistor is connected between the control node and the second terminal, and includes a gate connected to a reset terminal receiving the reset signal.

In an embodiment, the stage may further include a second reset transistor connected between the third terminal and the first node, and including a gate connected to the reset terminal, wherein the reset transistor and the second reset transistor are N-channel transistors.

In an embodiment, the stage may further include a second reset transistor connected between the third terminal and the first node, and including a gate connected to a second reset terminal, wherein the reset transistor is a P-channel transistor, and the second reset transistor is an N-channel transistor, wherein the controller is further configured to control a timing at which a reset signal input to the reset terminal of the reset transistor is a gate-on voltage and a timing at which a second reset signal input to the second reset terminal of the second reset transistor is a gate-on voltage to be the same.

BRIEF DESCRIPTION OF THE DRAWINGS

The above and other aspects and features of certain embodiments will be more apparent from the following description taken in conjunction with the accompanying drawings, in which.

DETAILED DESCRIPTION

Figure 1:
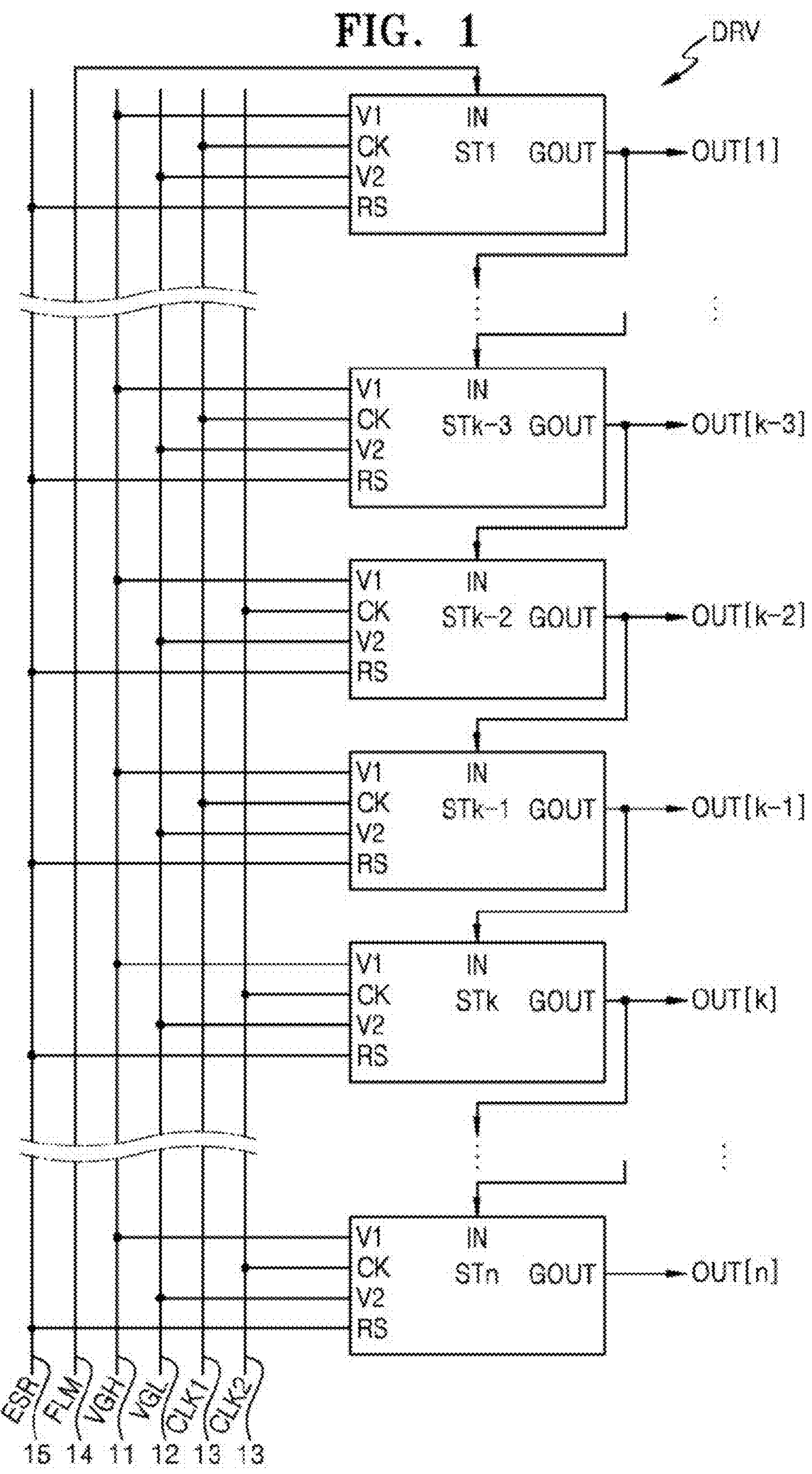
FIG. 1 is a diagram schematically illustrating a driving circuit, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

When X and Y are connected to each other, directly or indirectly, it may include a case where X and Y are physically connected to each other, a case where X and Y are functionally connected to each other, and a case where X and Y are electrically connected to each other. When X and Y are indirectly connected, it may include a case where X and Y are indirectly connected with other elements therebetween. Here, X and Y may be elements (e.g., apparatuses, devices, circuits, wirings, electrodes, terminals, films, layers, and regions). Accordingly, a connection relationship is not limited to a certain connection relationship, for example, a connection relationship shown in the drawings or the detailed description, and may include other connection relationships than the connection relationship shown in the drawings or the detailed description.

In the following embodiments, when X and Y are connected to each other, it may mean that X and Y are electrically connected to each other. When X and Y are electrically connected to each other, it may include a case where X and Y are directly connected to each other and/or a case where X and Y are indirectly connected to each other with other components therebetween. When X and Y are indirectly connected, it may include a case where one or more elements (e.g., switches, transistors, capacitors, inductors, resistors, or diodes) that enable electrical connection between X and Y are connected between X and Y.

In the following embodiments, the term "on" used in association with a device state may refer to a state in which a device is activated, and the term "off" may refer to a state in which a device is deactivated. The term "on" used in association with a signal received by a device may refer to a signal for activating the device, and the term "off" may refer to a signal for deactivating the device. A device may be activated by a high-level voltage or a low-level voltage. For example, a P-channel transistor (P-type transistor) is activated by a low-level voltage, and an N-channel transistor (N-type transistor) is activated by a high-level voltage. Accordingly, it should be understood that "on" voltages for the P-channel transistor and the N-channel transistor have opposite (low and high) voltage levels. Hereinafter, a voltage for activating (turning on) a transistor is referred to as a gate-on voltage, and a voltage for deactivating (turning off) a transistor is referred to as a gate-off voltage.

Embodiments of the disclosure relate to a driving circuit for display apparatuses, which includes a reset circuit in at least one stage to address issues such as stress on transistors. The reset circuit is designed to initialize internal nodes to predefined voltage levels, thereby reducing stress caused by prolonged low-level signals at these nodes and ensuring reliable operation under abnormal power-on/off sequences. Additionally, the inclusion of specific auxiliary transistors helps distribute stress and further mitigates long-term degradation. By managing voltage transitions and optimizing transistor usage, the reset circuit contributes to stable gate signal output with lower power consumption. Furthermore, the reset circuit alleviates issues such as leakage current, threshold voltage shifts, and potential failures due to accumulated stress, particularly during extended or low-frequency operation.

Figure 2:
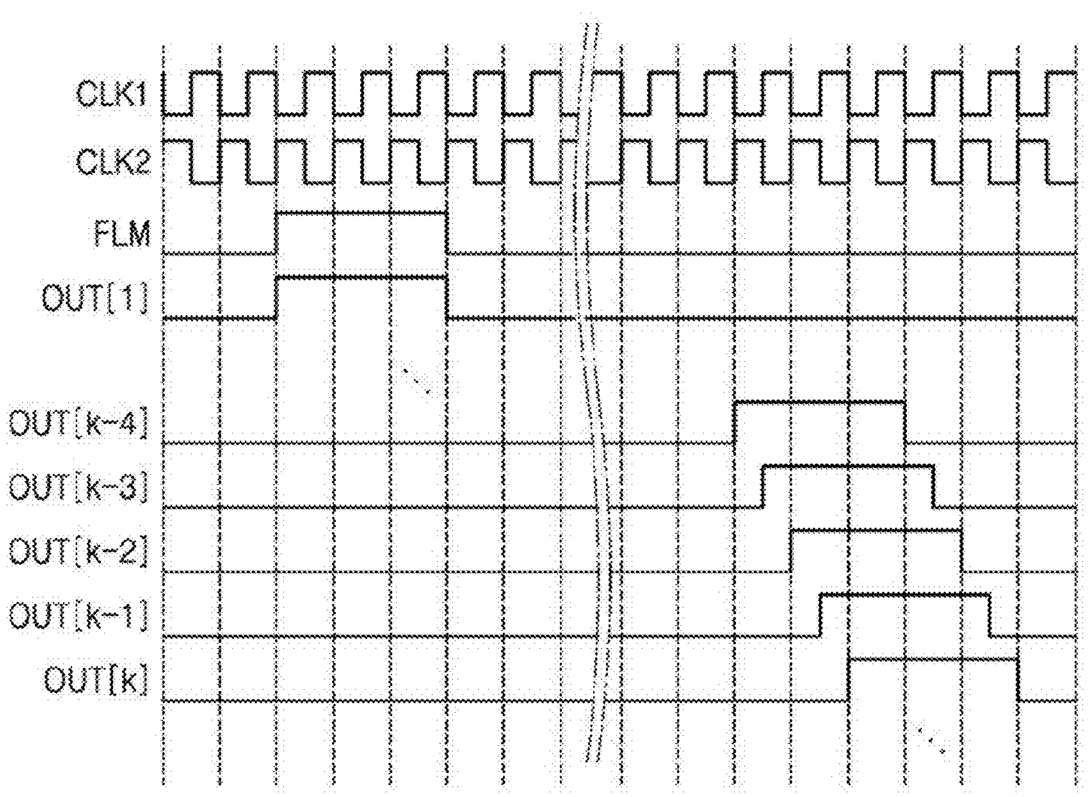
FIG. 2 is a diagram schematically illustrating input/output signals of a driving circuit, according to an embodiment.

FIG. 1 is a diagram schematically illustrating the driving circuit, according to an embodiment. FIG. 2 is a diagram schematically illustrating input/output signals of the driving circuit, according to an embodiment.

Referring to FIG. 1, the driving circuit DRV according to an embodiment includes a plurality of stages (e.g., ST1 to STn). The plurality of stages (e.g., ST1 to STn) may sequentially output output signals (e.g., OUT[1], . . . , OUT[k-4], OUT[k-3], OUT[k-2], OUT[k-1], OUT[k], . . . , and OUT[n]) to signal lines. For example, the output signals may be output to output lines such as gate lines of a display panel. Where n is a positive integer and k is a positive integer less than or equal to n.

Each of the plurality of stages (e.g., ST1 to STn) may be connected to one or more signal lines. The signal lines may include at least one input line and at least one output line. The at least one input line may include at least one clock line 13 for inputting at least one clock signal to each of the plurality of stages (e.g., ST1 to STn) and at least one voltage line (e.g., a first voltage line 11, a second voltage line 12, an external start signal line 14, and a reset signal line 15) for inputting at least one voltage signal. At least one output signal OUT generated by each of the plurality of stages (e.g., ST1 to STn) may be output to at least one output line (e.g., a gate line).

Each of the plurality of stages (e.g., ST1 to STn) may include a plurality of terminals to and/or from which a plurality of signals are input and/or output. The terminal may refer to one end of a signal line. The plurality of signals may include a clock signal and a voltage signal. The plurality of terminals may include an input terminal IN, a first voltage input terminal V1, a second voltage input terminal V2, a clock terminal CK, an output terminal GOUT and a reset terminal RS.

Figure 3:
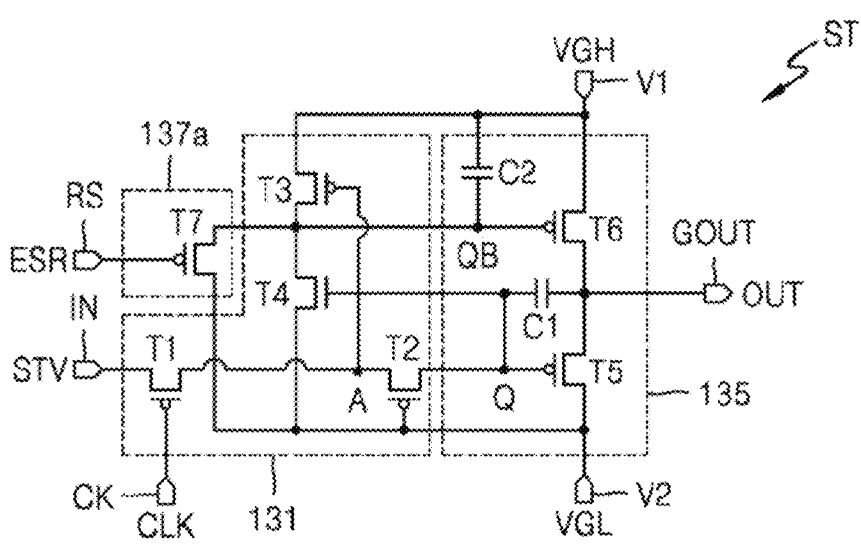
FIGS. 3 and 4 are diagrams illustrating any one of a plurality of stages included in the driving circuit of FIG. 1, according to an embodiment.

The plurality of stages (e.g., ST1 to STn) may respectively output output signals (e.g., OUT[1], . . . , OUT[k-3], OUT[k-2], OUT[k-1], OUT[k], . . . , and OUT[n]) in response to a start signal STV (see FIG. 3). For example, an $n^{th}$ stage STn may output an $n^{th}$ output signal OUT[n] to an $n^{th}$ signal line. The start signal STV may be an external start signal FLM for controlling a timing of a first output signal OUT[1] and may be input to a first stage ST1.

The start signal STV may be input (supplied) to the input terminal IN. The start signal may be the external start signal FLM or an output signal output from a previous stage (hereinafter, a 'previous output signal'). The external start signal FLM may be input as the start signal STV to the input terminal IN of the first stage ST1, and a previous output signal may be input as the start signal STV to the input terminal IN of each of the second to $n^{th}$ stages ST2 to STn. A previous stage may be a stage located at least one before a current stage. In FIG. 1, a previous stage is a stage located immediately before a current stage. For example, a k-$3^{th}$ output signal OUT[k-3] output from a k-$3^{th}$ stage STk-3 may be input as the start signal STV to the input terminal IN of a k-$2^{th}$ stage STK-2.

A clock signal CLK (e.g., FIG. 3) may be input to the clock terminal CK. The clock signal CLK may include a first clock signal CLK1 and a second clock signal CLK2. The first clock signal CLK1 or the second clock signal CLK2 may be input to the clock terminal CK. In an embodiment, the first clock signal CLK1 is input to the clock terminals CK of odd-numbered stages (e.g., ST1, STK-3, etc.) and the second clock signal CLK2 may be input to the clock terminals CK of even-numbered stages (e.g., STK-2, etc.) In an embodiment, the second clock signal CLK2 is input to the clock terminals CK of the odd-numbered stages and the first clock signal CLK1 is input to the clock terminals CK of the even-numbered stages. In an embodiment, the clock signals CLK1 and CLK2 are square wave signals that alternate between a high-level voltage and a low-level voltage. These signals control the timing of transistor operations within the stages of the driving circuit. The second clock signal CLK2 may be phase-shifted with respect to the first clock signal CLK1. For example, the second clock signal CLK2 may have the same waveform as the first clock signal CLK1, but be delayed by a certain interval (e.g., half a period).

A first voltage VGH may be input to the first voltage input terminal V1, and a second voltage VGL may be input to the second voltage input terminal V2. The second voltage VGL may have a lower voltage level than the first voltage VGH.

As shown in FIG. 2, the first clock signal CLK1 and the second clock signal CLK2 may be square wave signals in which a high-level voltage and a low-level voltage are repeated. In an embodiment, the first clock signal CLK1 and the second clock signal CLK2 may be square wave signals in which the first voltage VGH and the second voltage VGL are repeated. The first clock signal CLK1 and the second clock signal CLK2 may have the same waveform and may be phase-shifted signals. For example, the second clock signal CLK2 may have the same waveform as the first clock signal CLK1 and may be input with its phase shifted (delayed) at certain intervals. The second clock signal CLK2 may be half (½) period shifted with respect to the first clock signal CLK1. In the first clock signal CLK1 and the second clock signal CLK2, a duration during which a high-level voltage is maintained for one period may be the same as a duration during which a low-level voltage is maintained for one period.

An output signal may be output from the output terminal GOUT. As shown in FIG. 2, the output signals (e.g., OUT [1], . . . , OUT[k-3], OUT[k-2], OUT[k-1], OUT[k], . . . , and OUT[n]) output from the output terminals GOUT of the plurality of stages (e.g., ST1 to STn) may be sequentially shifted by a certain interval. In an embodiment, the plurality of stages (e.g., ST1 to STn) may shift and sequentially output the output signals (e.g., OUT[1], . . . , OUT[k-3], OUT[k-2], OUT[k-1], OUT[k], . . . , and OUT[n]) of a high level by ½ period. In an embodiment, a high-level voltage and a low-level voltage of output signals may be respectively the first voltage VGH and the second voltage VGL. In an embodiment, the plurality of stages (e.g., ST1 to STn) may sequentially output high-level output signals, with each stage's output signal delayed by half a clock period relative to the preceding stage.

Figure 4:
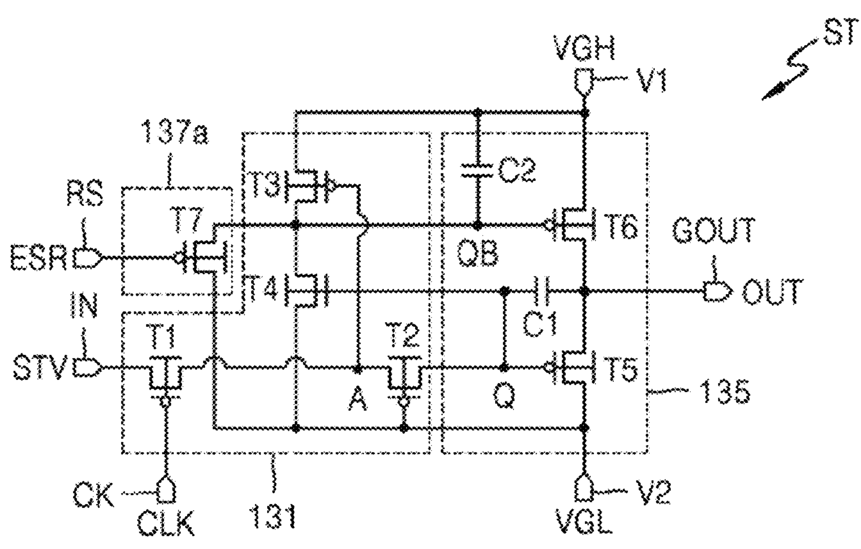
Figure 5:
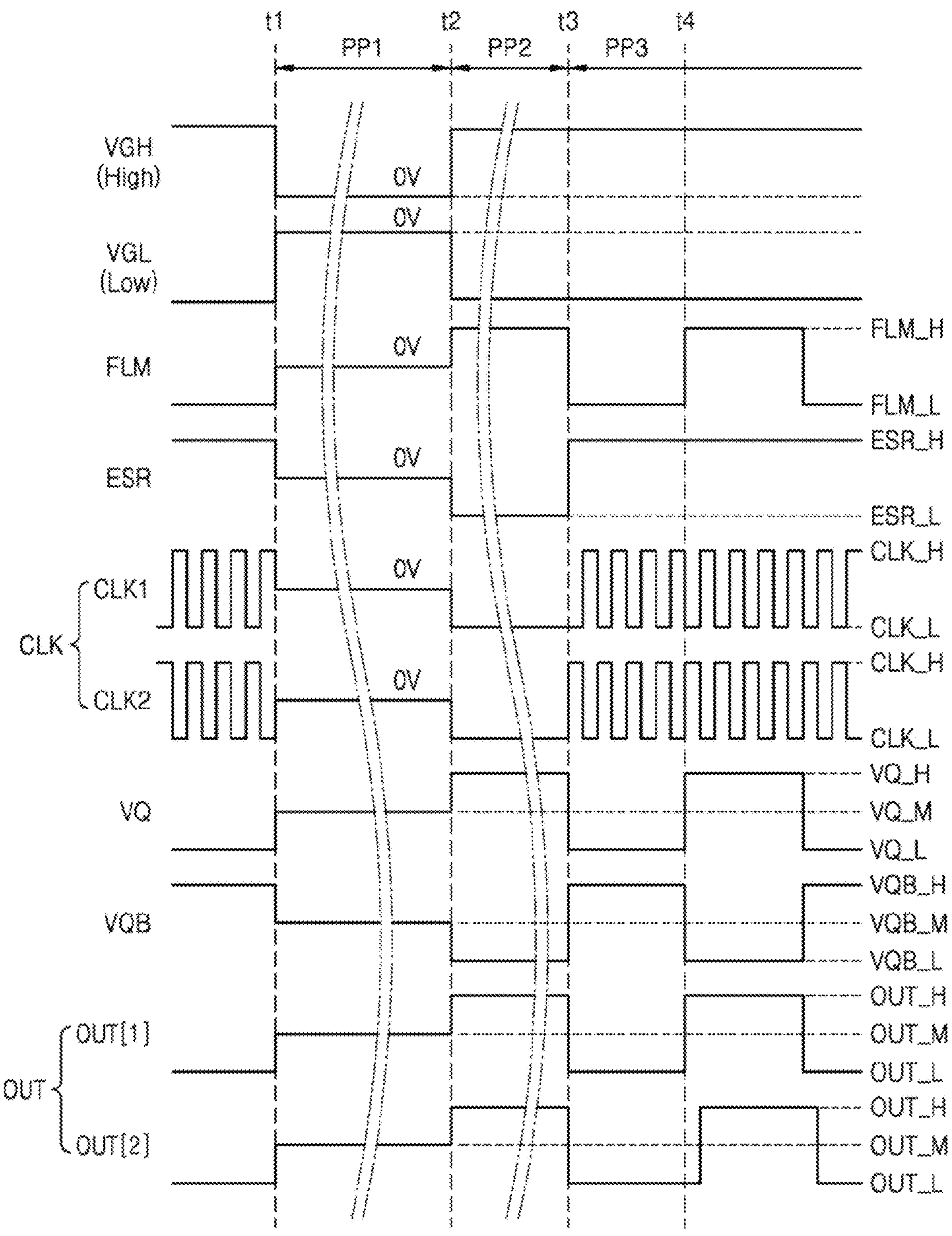
FIGS. 5 and 6 are timing diagrams for describing an operation of a stage, according to an embodiment.
Figure 6:
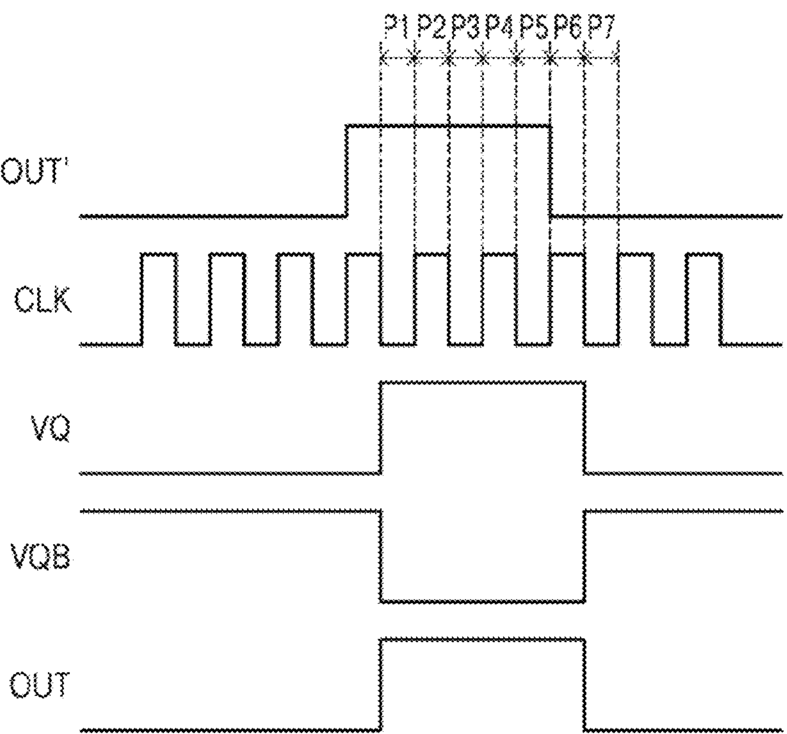

FIGS. 3 and 4 are diagrams illustrating any one of a plurality of stages included in the driving circuit of FIG. 1, according to an embodiment. FIGS. 5 and 6 are timing diagrams for describing an operation of a stage, according to an embodiment.

Referring to FIG. 3, in an embodiment, a stage ST includes a control circuit 131, an output circuit 135, and a reset circuit 137*a*. Each of the control circuit 131, the output circuit 135, and the reset circuit 137 may include at least one transistor. The at least one transistor may include an N-channel transistor and/or a P-channel transistor. For example, a fourth transistor T4 may be an N-channel transistor, and a first transistor T1, a second transistor T2, a third transistor T3, a fifth transistor T5, a sixth transistor T6, and a seventh transistor T7 may be P-channel transistors.

A P-channel transistor may be a P-channel silicon transistor. The silicon transistor may include a silicon semiconductor, and the silicon semiconductor may include amorphous silicon or polysilicon. For example, the silicon transistor may be a low-temperature polycrystalline silicon (LTPS) thin-film transistor.

An N-channel transistor may be an N-channel oxide transistor. The oxide transistor may include an oxide semiconductor, and the oxide semiconductor may include a Zinc (Zn) oxide-based material such as Zn oxide, Indium-Zinc (In—Zn) oxide, or Gallium-Indium-Zinc (Ga—In—Zn) oxide. In some embodiments, the oxide semiconductor may be an In—Ga—Zn—O (IGZO) semiconductor. In some embodiments, the oxide semiconductor may be an In—Sn—Ga—Zn—O (ITGZO) semiconductor. For example, the oxide transistor may be a low-temperature polycrystalline oxide (LTPO) thin-film transistor.

A gate-on voltage of the P-channel transistor may be a low-level voltage, and a gate-off voltage of the P-channel transistor may be a high-level voltage. A gate-on voltage of the N-channel transistor may be a high-level voltage, and a gate-off voltage of the N-channel transistor may be a low-level voltage.

The control circuit 131 may control voltages of a first node A, a second node Q, and a third node QB in response to a signal input to the input terminal IN. For example, the control circuit 131 may control voltages of a first node A, a second node Q, and a third node QB in response to the start signal STV (e.g., the external start signal FLM (see FIG. 1) or a previous output signal). The control circuit 131 may include the first to fifth transistors T1 to T4.

The first transistor T1 may be connected between the input terminal IN and the first node A. A gate of the first transistor T1 may be connected to a clock terminal CK. The first transistor T1 may be turned on when the clock signal CLK input to the clock terminal CK is at a low level, allowing it to transmit the start signal from the input terminal IN to the first node A. The clock signal CLK may be the first clock signal CLK1 or the second clock signal CLK2.

In an embodiment, the first clock signal CLK1 is input to the clock terminal CK of an odd-numbered stage ST, and the second clock signal CLK2 is input to the clock terminal CK of an even-numbered stage ST. In an embodiment, the second clock signal CLK2 is input to the clock terminal CK of an odd-numbered stage ST, and the first clock signal CLK1 is input to the clock terminal CK of an even-numbered stage ST.

The second transistor T2 may be connected between the first node A and the second node Q. A gate of the second transistor T2 may be connected to the second voltage input terminal V2. The second transistor T2 may be turned on by the second voltage VGL input to the second voltage input terminal V2, enabling it to transmit the start signal received from the first transistor T1 to the second node Q. In an embodiment, the second transistor T2 is always in a turned-on state when the stage ST is receiving power. In a stage where the second transistor T2 is omitted and the first transistor T1 is provided alone, stress on the first transistor T1 may increase due to a long-term low level of the second node Q or the first node A. Because the second transistor T2 is provided, the first transistor T1 and the second transistor T2 may share stress caused by a long-term low level of the second node Q or the first node A, thereby relieving stress on the first transistor T1. The relieving of the stress may reduce or prevent threshold voltage shifts and leakage currents and increase transistor lifespan. Also, when the first transistor T1 is turned off, a line voltage drop between the input terminal IN and the first node A may be prevented by the second transistor T2. The prevention of the line voltage drop may maintain signal integrity to ensure that subsequent stages receive the correct voltage levels and avoid potential disruption in the sequential operations of the gate driver circuit. Without the second transistor T2, the first transistor T1 would handle the transmission of signals and face stress due to prolonged low-level voltages at a first node (A) or a second node (Q). The second transistor T2 shares this stress with the first transistor T1. Further, when the first transistor T1 is turned off, the second transistor T2 ensures that the voltage at the first node (A) remains stable, preventing unwanted voltage drops. Further, the second transistor T2 may facilitate a smooth transmit of the start signal STV to the second node (Q) by operating in tandem with the first transistor T1.

The third transistor T3 may be connected between the first voltage input terminal V1 and the third node QB. A gate of the third transistor T3 may be connected to the first node A. The third transistor T3 may be turned on when a start signal transmitted to the first node A is at a low level, allowing it to transmit the first voltage VGH from the first voltage input terminal V1 to the third node QB. Due to the third transistor T3, a voltage of the third node QB may be a voltage of a voltage level obtained by inverting a voltage level of the first node A.

The fourth transistor T4 may be connected between the third node QB and the second voltage input terminal V2. A gate of the fourth transistor T4 may be connected to the second node Q. The fourth transistor T4 may be turned on when a start signal transmitted to the second node Q is at a high level, allowing it to transmit the second voltage VGL from the second voltage input terminal V2 to the third node QB. Due to the fourth transistor T4, a voltage of the third node QB may be a voltage of a voltage level obtained by inverting a voltage level of the second node Q.

The third transistor T3 and the fourth transistor T4 may control a voltage level of the third node QB according to a voltage level of the first node A or the second node Q, and thus, may function as inverters or level shifters. In an embodiment, the third transistor T3 and the fourth transistor T4 are connected to form an inverter or replaced by an inverter.

The output circuit 135 may be connected between the first voltage input terminal V1 and the second voltage input terminal V2. The output circuit 135 may output an output signal OUT of a high-level voltage or a low-level voltage according to voltage levels of the second node Q and the third node QB. The output circuit 135 may include the fifth transistor T5 and the sixth transistor T6. The output circuit 135 may further include a first capacitor C1 and a second capacitor C2.

The fifth transistor T5 may be connected between the output terminal GOUT and the second voltage input terminal V2. A gate of the fifth transistor T5 may be connected to the second node Q. The fifth transistor T5 may be a pull-down transistor that transmits a low-level voltage to the output terminal GOUT. The fifth transistor T5 may be turned on when the second node Q is at a low level, allowing it to transmit the second voltage VGL of a low-level voltage from the second voltage input terminal V2 to the output terminal GOUT.

The sixth transistor T6 may be connected between the first voltage input terminal V1 and the output terminal GOUT. A gate of the sixth transistor T6 may be connected to the third node QB. The sixth transistor T6 may be a pull-up transistor that transmits a high-level voltage to the output terminal GOUT. The sixth transistor T6 may be turned on when the third node QB is at a low level, allowing it to output the first voltage VGH of a high-level voltage from the first voltage input terminal V1 to the output terminal GOUT.

The first capacitor C1 may be connected between the output terminal GOUT and the second node Q. The second capacitor C2 may be connected between the first voltage input terminal V1 and the third node QB. The first capacitor C1 may maintain a voltage of the second node Q, and the second capacitor C2 may maintain a voltage of the third node QB.

The reset circuit 137*a* may reset the third node QB. The reset circuit 137*a* may include the seventh transistor T7. The seventh transistor T7 may reset the third node QB based on a reset signal ESR input to the reset terminal RS. The seventh transistor T7 may be connected between the third node QB and the second voltage input terminal V2, and a gate of the seventh transistor T7 may be connected to the reset terminal RS. The seventh transistor T7 may be turned on when the reset signal ESR is applied at a low level to the reset terminal RS and may reset (initialize) the third node QB to the second voltage VGL.

In an embodiment, the reset signal ESR is input at a low level to the first to $n^{th}$ stages ST1 to STn in a specific section (e.g., a reset section). For example, the reset signal ESR of a low level may be input to initialize (reset) a voltage of the third node QB before operation of a device including the stages after power-on of the device and/or when an operation error occurs in the device.

In an embodiment, as shown in FIG. 4, the first to seventh transistors T1 to T7 of the stage ST are dual gate transistors each further including a back gate. Each of the first to seventh transistors T1 to T7 may include a first gate that is a top gate (gate) located over a semiconductor and a second gate that is a bottom gate (back gate) located under the semiconductor. The back gate of each of the first to seventh transistors T1 to T7 may be connected to its own gate. For example, the back gate of the first transistor T1 may be connected to the top gate of the first transistor T1.

An operation of the stage illustrated in FIGS. 4 and 5 will be described with reference to FIGS. 5 and 6.

Referring to FIG. 5, a first section PP1 (e.g., a first period) and a second section PP2 (e.g., a second period) are sections (e.g., periods) before the output signal OUT is output. A third section PP3 (e.g., a third period) is a section in which the output signal OUT is output. The first section PP1, the second section PP2, and the third section PP3 may be distinguished according to a voltage level of an input signal input to the plurality of stages (e.g., ST1 to STn). The input signal may include the first voltage VGH, the second voltage VGL, the external start signal FLM, the reset signal ESR, and the clock signal CLK.

The first section PP1 is a section in which input signals are set to a ground (0 V). The first section PP1 may be a section from a first time t1 to a second time t2.

Starting from the first time t1, in the first section PP1, 0 V may be applied to the first voltage line 11, the second voltage line 12, the clock line 13, and the reset signal line 15 connected to the plurality of stages (e.g., ST1 to STn). 0 V may be input to the external signal line 14 connected to the first stage ST1 from among the plurality of stages (e.g., ST1 to STn). In an embodiment, the 0 V is provided by a power supply circuit 170 or a controller 190.

As input signals of 0 V are input to the plurality of stages (e.g., ST1 to STn), in the first section PP1, a voltage VQ_M of the second node Q of each of the plurality of stages (e.g., ST1 to STn) may be charged to a voltage of a higher level than a low-level voltage VQ_L, and a voltage VQB_M of the third node QB may be discharged to a voltage of a lower level than a high-level voltage VQB_H. In an embodiment, in the first section PP1, the voltage VQB_M of the third node QB of each of the plurality of stages (e.g., ST1 to STn) may be 0 V.

In the first section PP1, a voltage OUT_M of the output signal OUT of each of the plurality of stages (e.g., ST1 to STn) may be a voltage of a higher level than a low-level voltage OUT_L. For example, in the first section PP1, the voltage OUT_M of the output signal OUT of each of the plurality of stages (e.g., ST1 to STn) may be 0 V.

The second section PP2 may be a reset section in which the third node QB of each of the plurality of stages (e.g., ST1 to STn) is fully discharged. The second section PP2 may span from the second time t2 to a third time t3, during which the clock signal CLK of a square wave is applied. The second time t2 may be a power-on time. The power-on time may be a time during which the first voltage VGH and the second voltage VGL are applied.

Starting from the second time t2, in the second section PP2, the first voltage VGH of a high level and the second voltage VGL of a low level may be input to the plurality of stages (e.g., ST1 to STn). In this case, the external start signal FLM input to the first stage ST1 may be a high-level voltage FLM_H, the reset signal ESR input to the plurality of stages (e.g., ST1 to STn) may be a low-level voltage ESR_L, and the clock signal CLK may be a low-level voltage CLK_L. In an embodiment, the high-level voltage FLM_H of the external start signal FLM may be the first voltage VGH. The low-level voltage ESR_L of the reset signal ESR and the low-level voltage CLK_L of the clock signal CLK may be the second voltage VGL.

The seventh transistor T7 of each of the plurality of stages (e.g., ST1 to STn) may be turned on by the reset signal ESR of the low-level voltage ESR_L, allowing the second voltage VGL to be transmitted to the third node QB. Accordingly, in the second section PP2, a voltage VQB of the third node QB of each of the plurality of stages (e.g., ST1 to STn) may be discharged to the second voltage VGL. The sixth transistor T6 with its gate connected to the third node QB may be turned on, allowing the first voltage VGH to be transmitted to the output terminal GOUT. Accordingly, the plurality of stages (e.g., ST1 to STn) may simultaneously output the output signal OUT of a high-level voltage OUT_H.

The first transistor T1 of each of the plurality of stages (e.g., ST1 to STn) may be turned on by the clock signal CLK of the low-level voltage CLK_L, allowing the start signal STV (see FIGS. 3 and 4) to be transmitted to the first node A and the second node Q. The start signal STV may be the external start signal FLM of the high-level voltage FLM_H and a previous output signal of a high-level voltage OUT_H (e.g., the output signal OUT[1] of the first stage input to the second stage). Accordingly, in the second section PP2, a voltage of the first node A and a voltage VQ of the second node Q of each of the plurality of stages (e.g., ST1 to STn) may be a high-level voltage VQ_H. The fifth transistor T5 with its gate connected to the second node Q may be turned off.

Starting from the third time t3, the clock signal CLK of a square wave may be input to the plurality of stages (e.g., ST1 to STn). After a certain delay from the third time t3, at a fourth time t4, the external start signal FLM of the high-level voltage FLM_H may be input to the first stage ST1. Starting from the fourth time t4, the plurality of stages (e.g., ST1 to STn) may sequentially output the output signals OUT.

Starting from the third time t3, in the third section PP3, the clock signal CLK in which a high-level voltage CLK_H and the low-level voltage CLK_L alternate with each other may be input to the plurality of stages (e.g., ST1 to STn). Starting from the third time t3, in the third section PP3, the reset signal ESR of a high-level voltage ESR_H may be input to the plurality of stages (e.g., ST1 to STn). In an embodiment, the high-level voltage ESR_H of the reset signal ESR and the high-level voltage CLK_H of the clock signal CLK may be the first voltage VGH. In the third section PP3, the first voltage VGH and the second voltage VGL may be input to the plurality of stages (e.g., ST1 to STn). The seventh transistor T7 of each of the plurality of stages (e.g., ST1 to STn) may be turned off by the reset signal ESR of the high-level voltage ESR_H. That is, while the plurality of stages (e.g., ST1 to STn) operate to output the output signal OUT of the high-level voltage OUT_H, the seventh transistor T7 may be turned off.

At a fourth time t4, the start signal FLM of the high-level voltage FLM_H may be input to the first stage ST1, and the plurality of stages (e.g., ST1 to STn) may operate to sequentially output output signals (e.g., OUT[1] to OUT[n]) of the high-level voltage OUT_H.

Starting from the third time t3 to the fourth time t4, the voltage VQ of the second node Q of each of the plurality of stages (e.g., ST1 to STn) may be the low-level voltage VQ_L, and the voltage VQB of the third node QB may be the high-level voltage VQB_H. Starting from the third time t3 to the fourth time t4, the output signal OUT of each of the plurality of stages (e.g., ST1 to STn) may be a low-level voltage OUT_L.

Starting from the fourth time t4, the voltage VQ of the second node Q of each of the plurality of stages (e.g., ST1 to STn) may be sequentially changed from the low-level voltage VQ_L to the high-level voltage VQ_H, and the voltage VQB of the third node QB may be sequentially changed from the high-level voltage VQB_H to a low-level voltage VQB_L. Startin from the fourth time t4, the output signals OUT of the plurality of stages (e.g., ST1 to STn) may be sequentially changed from the low-level voltage OUT_L to the high-level voltage OUT_H.

In an embodiment, when the first clock signal CLK1 is input to odd-numbered stages and the second clock signal CLK2 is input to even-numbered stages, the output signals OUT of the odd-numbered stages may be changed from the low-level voltage OUT_L to the high-level voltage OUT_H in synchronization with the low-level voltage CLK_L of the first clock signal CLK1, and the output signals OUT of the even-numbered stages may be changed from the low-level voltage OUT_L to the high-level voltage OUT_H in synchronization with the low-level voltage CLK_L of the second clock signal CLK2.

Hereinafter, an operation of one stage ST from among the plurality of stages (e.g., ST1 to STn) after the fourth time t4 illustrated in FIGS. 3 and 4 will be described with reference to FIG. 6. The stage ST may be an odd-numbered stage or an even-numbered stage.

In FIG. 6, the clock signal CLK, a previous output signal OUT', the voltage VQ of the second node Q, the voltage VQB of the third node QB, and the output signal OUT are illustrated. The clock signal CLK may be the first clock signal CLK1 or the second clock signal CLK2.

The previous output signal OUT' of a high level may be input to the input terminal IN, and in a first sub-section P1, the clock signal CLK of a low level may be input to the clock terminal CK.

The first transistor T1 may be turned on by the clock signal CLK of the low level. The second transistor T2 may be in a turned-on state due to the second voltage VGL of a low level. The previous output signal OUT' of a high level may be transmitted to the first node A and the second node Q of the stage ST due to the first transistor T1 and the second transistor T2 which are turned on, and the fifth transistor T5 may be turned off. The third transistor T3 with its gate connected to the first node A may be turned off, the fourth transistor T4 with its gate connected to the second node Q may be turned on, and a voltage of the third node QB may be the second voltage VGL of a low level. The sixth transistor T6 with its gate connected to the third node QB may be turned on, and the first voltage VGH of a high level may be transmitted to the output terminal GOUT. Accordingly, the output signal OUT of a high level may be output from the output terminal GOUT of the stage ST.

In a second sub-section P2, the clock signal CLK of a high level may be input to the clock terminal CK.

The first transistor T1 may be turned off by the clock signal CLK of a high level. The second transistor T2 may be in a turned-on state due to the second voltage VGL of a low level. Because the first node A and the second node Q maintain a high-level voltage in the first sub-section P1 due to the first capacitor C1, the fifth transistor T5 may be maintained in a turned-off state. The fourth transistor T4 with its gate connected to the second node Q may be turned on, and the second voltage VGL of a low level may be transmitted to the third node QB. The sixth transistor T6 with its gate connected to the third node QB may be turned on, and the first voltage VGH of a high level may be transmitted to the output terminal GOUT. Accordingly, the output signal OUT of a high level may be output from the output terminal GOUT of the stage ST.

An operation of the stage ST in a third sub-section P3 and a fifth sub-section P5 is the same as that of the stage ST in the first sub-section P1 and an operation of the stage ST in a fourth sub-section P4 and a sixth sub-section P6 is the same as that of the stage ST in the second sub-section P2, and thus, a description thereof will be omitted.

In a seventh sub-section P7, the clock signal CLK of a low level may be input to the clock terminal CK.

The first transistor T1 may be turned on by the clock signal CLK of a low level. The second transistor T2 may be in a turned-on state due to the second voltage VGL of a low level. The previous output signal OUT' of a low level may be transmitted to the first node A and the second node Q of the stage ST due to the first transistor T1 and the second transistor T2 which are turned on, and the fifth transistor T5 may be turned on. The second voltage VGL of a low level may be transmitted to the output terminal GOUT by the fifth transistor T5 that is turned on. Accordingly, the output signal OUT of a low level may be output from the output terminal GOUT of the stage ST.

The fourth transistor T4 with its gate connected to the second node Q may be turned off, the third transistor T3 with its gate connected to the first node A may be turned on, and a voltage of the third node QB may be the first voltage VGH of a high level. The sixth transistor T6 with its gate connected to the third node QB may be turned off.

Figure 7:
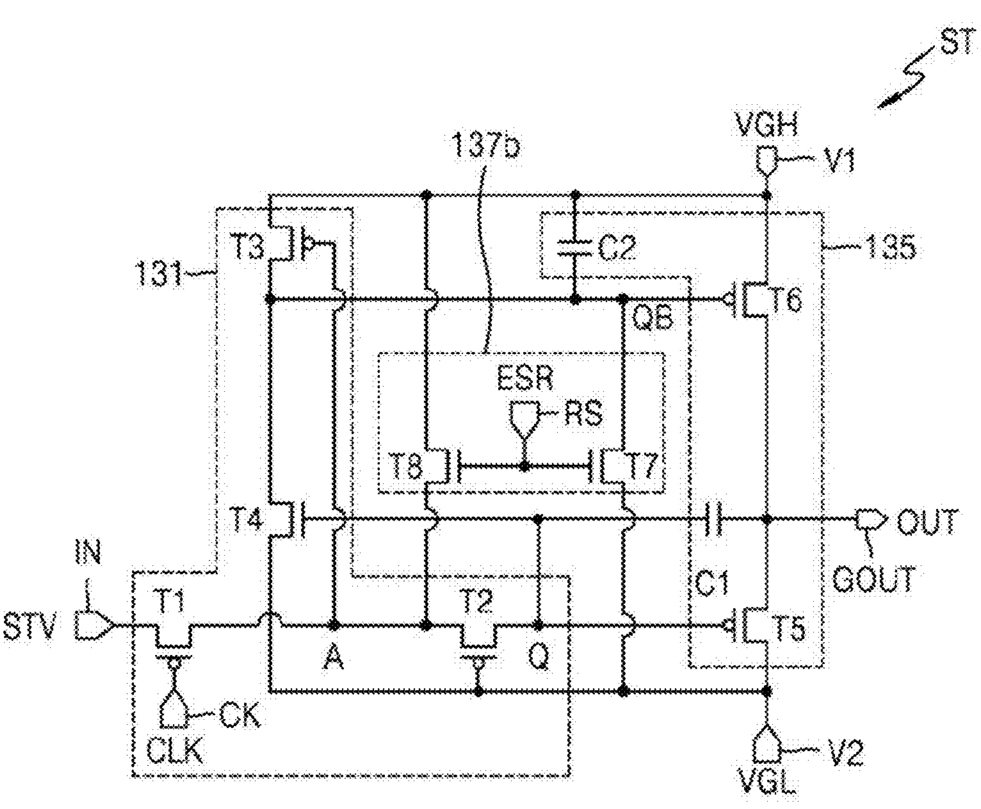
FIGS. 7 and 8 are diagrams illustrating any one of a plurality of stages included in the driving circuit of FIG. 1, according to an embodiment.
Figure 8:
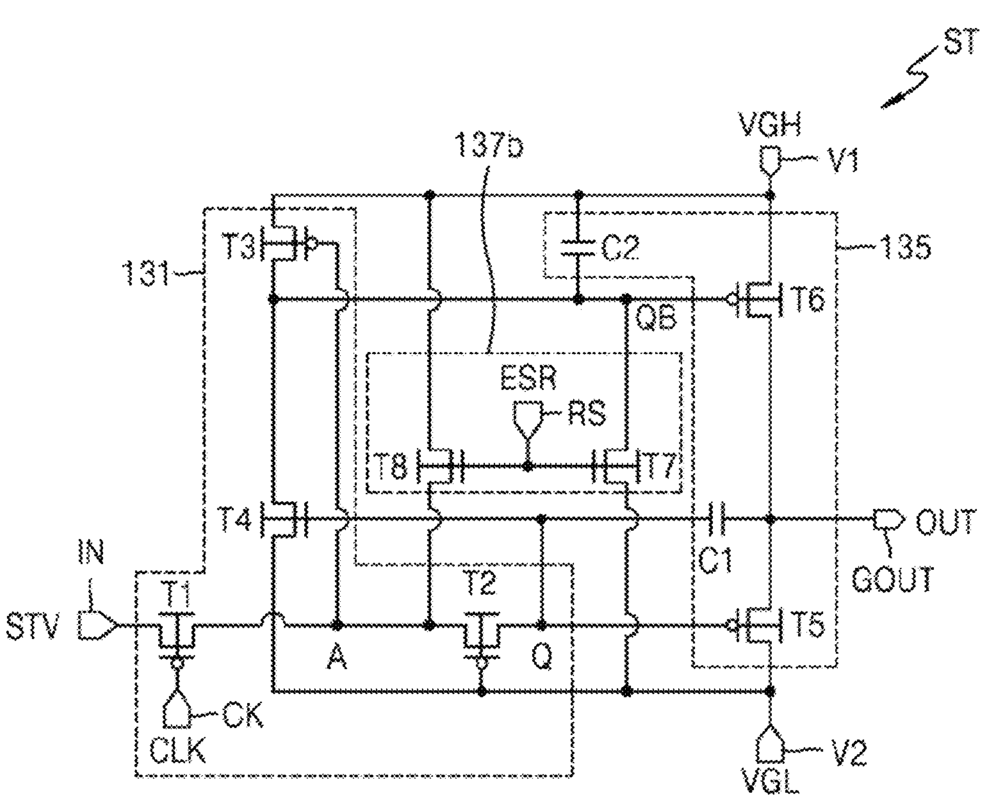
Figure 9:
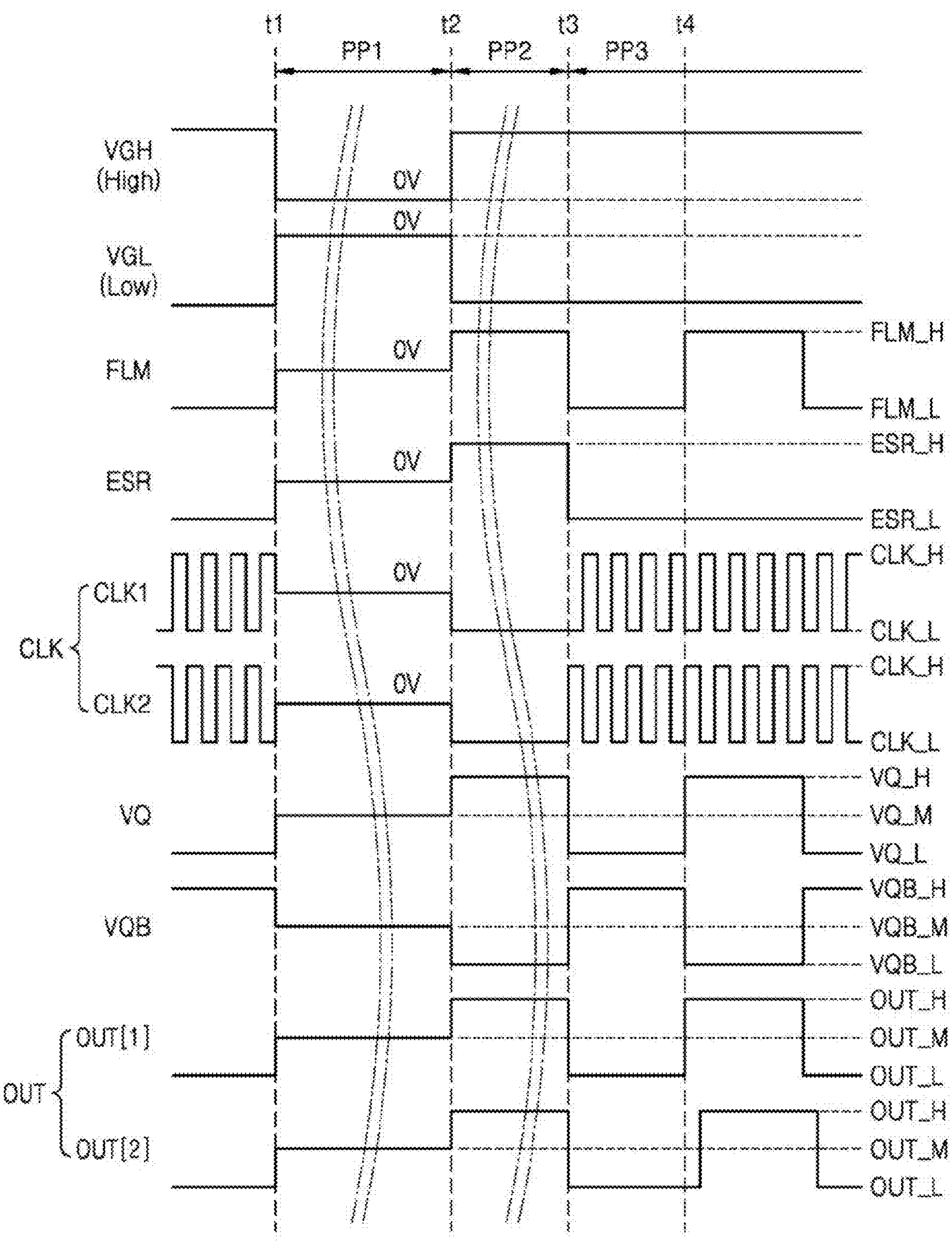
FIG. 9 is a timing diagram for describing an operation of a stage, according to an embodiment.

FIGS. 7 and 8 are diagrams illustrating any one of a plurality of stages included in the driving circuit of FIG. 1, according to an embodiment. FIG. 9 is a timing diagram for describing an operation of a stage, according to an embodiment. Hereinafter, a difference from a configuration and an operation described with reference to FIGS. 3 to 6 will be mainly described.

Referring to FIG. 7, the stage ST may include the control circuit 131, the output circuit 135, and a reset circuit 137*b*. Each of the control circuit 131, the output circuit 135, and the reset circuit 137*b* may include at least one transistor. The at least one transistor may include an N-channel transistor and/or a P-channel transistor. For example, a fourth transistor T4, a seventh transistor T7, and an eighth transistor T8 may be N-channel transistors, and a first transistor T1, a second transistor T2, a third transistor T3, a fifth transistor T5, and a sixth transistor T6 may be P-channel transistors.

In an embodiment, as shown in FIG. 8, the first to eighth transistors T1 to T8 of the stage ST are dual gate transistors each further including a back gate. Each of the first to eighth transistors T1 to T8 may include a first gate that is a top gate (gate) located over a semiconductor and a second gate that is a bottom gate (back gate) located under the semiconductor. The back gate of each of the first to eighth transistors T1 to T8 may be connected to its own top gate.

The stage ST illustrated in each of FIGS. 7 and 8 is the same as the stage ST of FIGS. 3 and 4 except that a configuration of the reset circuit 137*b* is different from that of the reset circuit 137*a* of the stage ST of FIGS. 3 and 4.

The reset circuit 137*b* may reset the second node Q and the third node QB. The reset circuit 137*b* may include the seventh transistor T7 and the eighth transistor T8. The seventh transistor T7 and the eighth transistor T8 may be N-channel oxide transistors. When the seventh transistor T7 and the eighth transistor T8 are N-channel transistors, the risk of leakage may be reduced during low frequency driving, and a threshold voltage shift margin may be increased compared to a case where the seventh transistor T7 and the eighth transistor T8 are P-channel transistors. For example, when the seventh transistor T7 and the eighth transistor T8 are P-channel transistors, a threshold voltage is about −1.42 V and a threshold voltage shift margin is about Δ0.9 V, whereas when the seventh transistor T7 and the eighth transistor T8 are N-channel transistors, a threshold voltage is about −1.04 V and a threshold voltage shift margin is about Δ1.28 V.

The seventh transistor T7 may be connected between the third node QB and the second voltage input terminal V2, and a gate of the seventh transistor T7 may be connected to the reset terminal RS. The seventh transistor T7 may be turned on when the reset signal ESR is applied at a high level to the reset terminal RS and may reset the third node QB to the second voltage VGL.

The eighth transistor T8 may be connected between the first voltage input terminal V1 and the first node A, and a gate of the eighth transistor T8 may be connected to the reset terminal RS. The eighth transistor T8 may be turned on when the reset signal ESR is applied at a high level to the reset terminal RS and may reset the first node A and the second node Q to the first voltage VGH.

Referring to FIG. 9, starting from a first time t1, in a first section PP1, 0 V may be input to the reset signal line 15 connected to the plurality of stages (e.g., ST1 to STn).

Starting from a second time t2, in a second section PP2, the reset signal ESR input to the reset signal line 15 connected to the plurality of stages (e.g., ST1 to STn) may be a high-level voltage ESR_H. The high-level voltage ESR_H of the reset signal ESR may be the first voltage VGH.

The seventh transistor T7 and the eighth transistor T8 of each of the plurality of stages (e.g., ST1 to STn) may be turned on by the reset signal ESR of the high-level voltage ESR_H, the second voltage VGL may be transmitted to the third node QB, and the first voltage VGH may be transmitted to the first node A and the second node Q. Accordingly, a voltage VQB of the third node QB of each of the plurality of stages (e.g., ST1 to STn) may be discharged to the second voltage VGL, and voltages of the first node A and the second node Q may be charged to the first voltage VGH. The fifth transistor T5 with its gate connected to the second node Q may be turned off, the sixth transistor T6 with its gate connected to the third node QB may be turned on, and the first voltage VGH may be transmitted to the output terminal GOUT. Accordingly, the output signal OUT of each of the plurality of stages (e.g., ST1 to STn) may be a high-level voltage OUT_H.

Starting from a third time t3, the reset signal ESR of a low-level voltage ESR_L may be input to the plurality of stages (e.g., ST1 to STn). In an embodiment, the low-level voltage ESR_L of the reset signal ESR may be the second voltage VGL. The seventh transistor T7 and the eighth transistor T8 of each of the plurality of stages (e.g., ST1 to STn) may be turned off by the reset signal ESR of the low-level voltage ESR_L. That is, while the plurality of stages (e.g., ST1 to STn) operate to output the output signal OUT of the high-level voltage OUT_H, the seventh transistor T7 and the eighth transistor T8 may be turned off.

Figure 10:
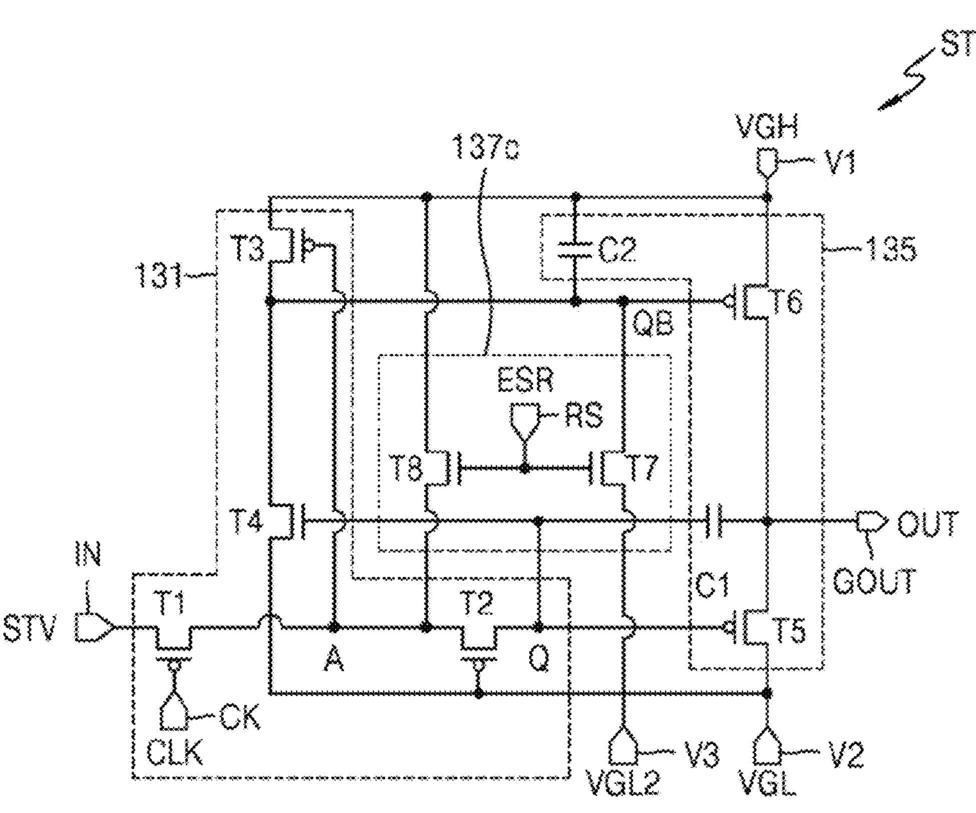
FIGS. 10 and 11 are diagrams illustrating any one of a plurality of stages included in the driving circuit of FIG. 1, according to an embodiment.
Figure 11:
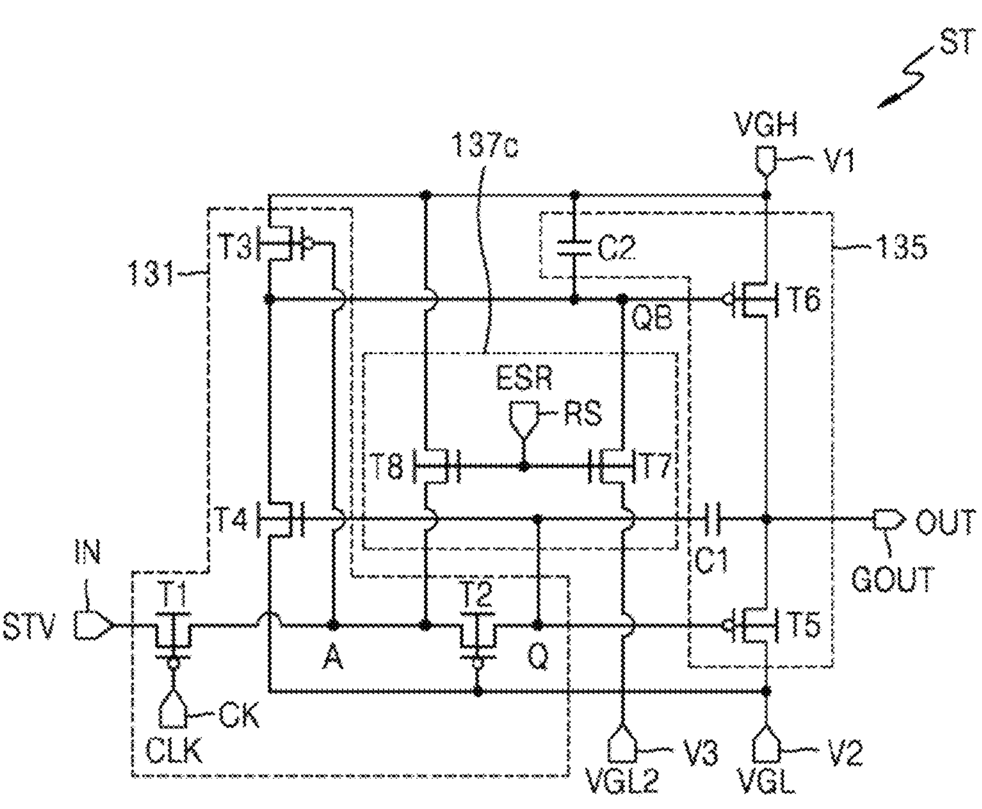

FIGS. 10 and 11 are diagrams illustrating any one of a plurality of stages included in the driving circuit of FIG. 1, according to an embodiment. The stage ST illustrated in each of FIGS. 10 and 11 is the same as the stage ST of FIGS. 7 and 8 except that a seventh transistor T7 of a reset circuit 137*c* is connected to a third voltage line for inputting a third voltage VGL2, unlike the reset circuit 137*b* of FIGS. 7 and 8.

The reset circuit 137*c* may include the seventh transistor T7 and an eighth transistor T8. The seventh transistor T7 and the eighth transistor T8 may be N-channel oxide transistors.

The seventh transistor T7 may be connected between the third node QB and a third voltage input terminal V3, and a gate of the seventh transistor T7 may be connected to the reset terminal RS. The third voltage input terminal V3 may be one end of the third voltage line. The seventh transistor T7 may be turned on when the reset signal ESR is applied at a high level to the reset terminal RS and may reset the third node QB to the third voltage VGL2. In an embodiment, the third voltage VGL2 is a voltage lower than the second voltage VGL.

The eighth transistor T8 may be connected between the first voltage input terminal V1 and the first node A, and a gate of the eighth transistor T8 may be connected to the reset terminal RS. The eighth transistor T8 may be turned on when the reset signal ESR is applied at a high level to the reset terminal RS and may reset the first node A and the second node Q to the first voltage VGH.

Referring to FIG. 9, starting from the first time t1, in the first section PP1, 0 V may be input to the third voltage line connected to the plurality of stages (e.g., ST1 to STn). Starting from the second time t2, the third voltage VGL2 may be input to the third voltage line connected to the plurality of stages (e.g., ST1 to STn).

Figure 12:
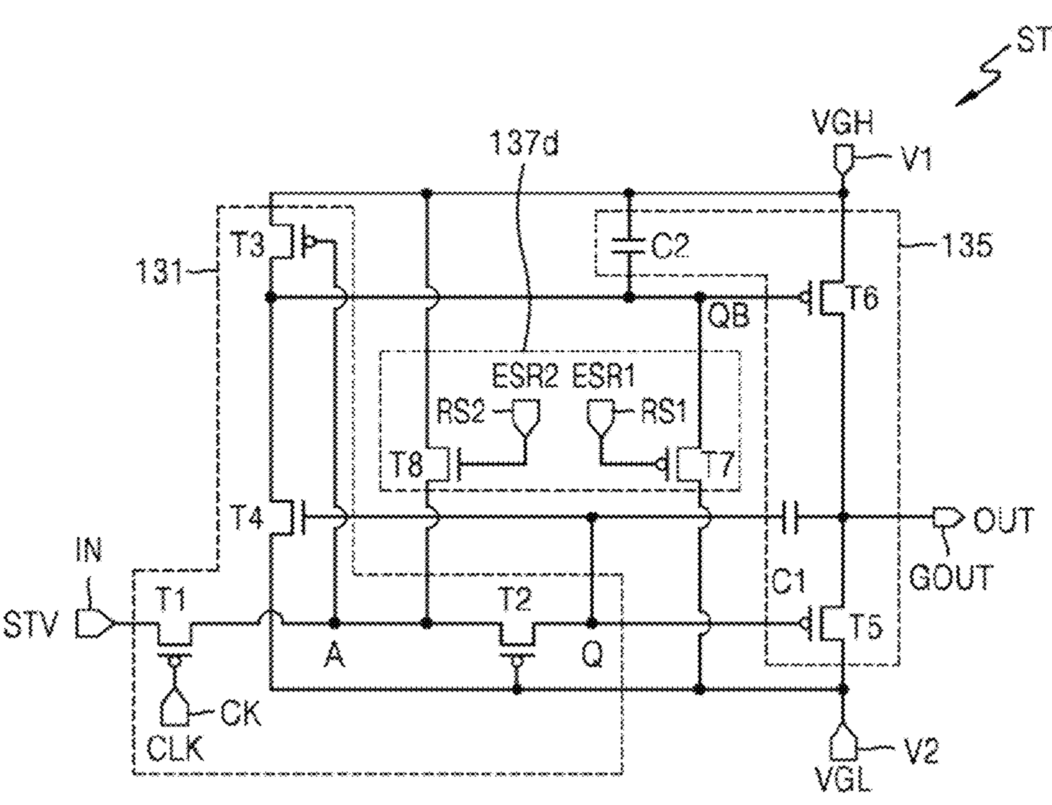
FIGS. 12 and 13 are diagrams illustrating any one of a plurality of stages included in the driving circuit of FIG. 1, according to an embodiment.
Figure 13:
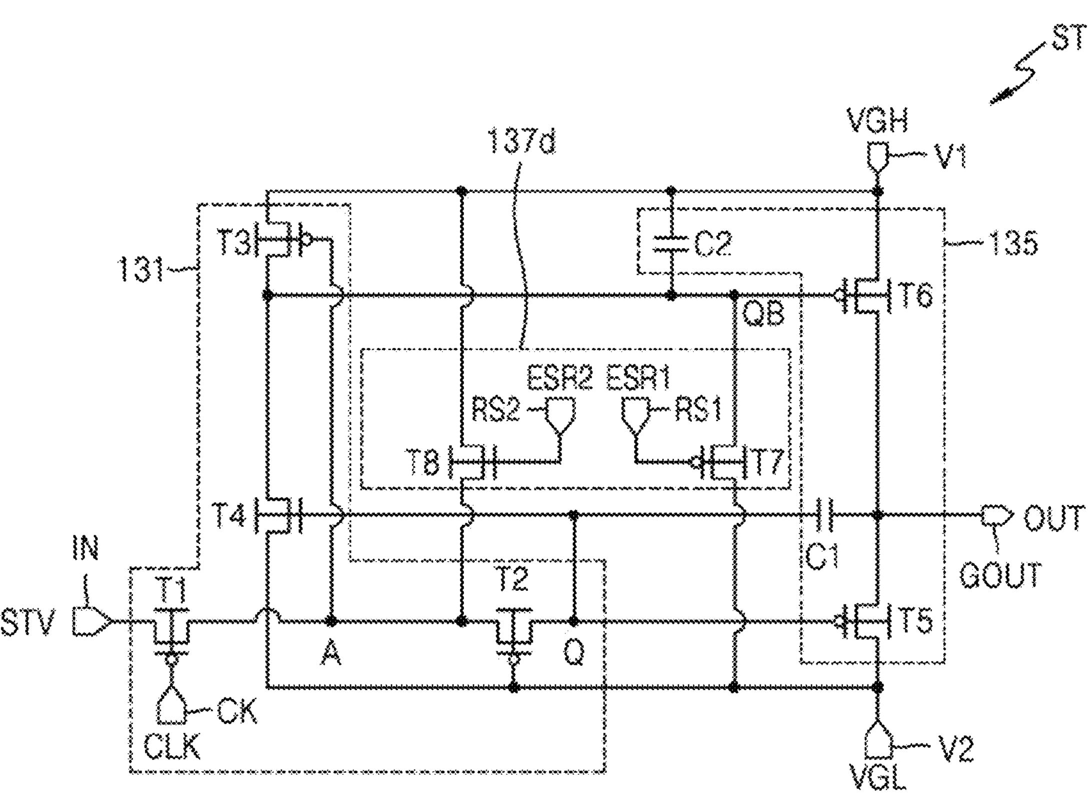

FIGS. 12 and 13 are diagrams illustrating any one of a plurality of stages included in the driving circuit of FIG. 1, according to an embodiment. The stage ST illustrated in each of FIGS. 12 and 13 is the same as the stage ST of FIGS. 3 and 4 except that a reset circuit 137*d* further includes an eighth transistor T8, unlike the reset circuit 137*a* of the stage ST of FIGS. 3 and 4.

The reset circuit 137*d* may include a seventh transistor T7 and the eighth transistor T8. The seventh transistor T7 may be a P-channel silicon transistor, and the eighth transistor T8 may be an N-channel oxide transistor. For example, the reset circuit 137*d* may include complementary transistors.

The seventh transistor T7 may be connected between the third node QB and the second voltage input terminal V2, and a gate of the seventh transistor T7 may be connected to a first reset terminal RS1. The seventh transistor T7 may be turned on when a first reset signal ESR1 is applied at a low level to the first reset terminal RS1 and may reset the third node QB to the second voltage VGL.

The eighth transistor T8 may be connected between the first voltage input terminal V1 and the first node A, and a gate of the eighth transistor T8 may be connected to a second reset terminal RS2. The eighth transistor T8 may be turned on when a second reset signal ESR2 is applied at a high level to the second reset terminal RS2 and may reset the first node A and the second node Q to the first voltage VGH.

In an embodiment, a timing at which the first reset signal ESR1 of a low level is input to the gate of the seventh transistor T7 and a timing at which the second reset signal ESR2 of a high level is input to the gate of the eighth transistor T8 are the same. That is, the seventh transistor T7 and the eighth transistor T8 may be simultaneously turned on so that the third node QB and the second node Q are simultaneously reset. The controller 190 may supply the reset signals ESR1 and ESR2.

A voltage change of the first reset signal ESR over time is the same as shown in FIG. 5, and a voltage change of the second reset signal ESR2 over time is the same as shown in FIG. 9.

Figure 14:
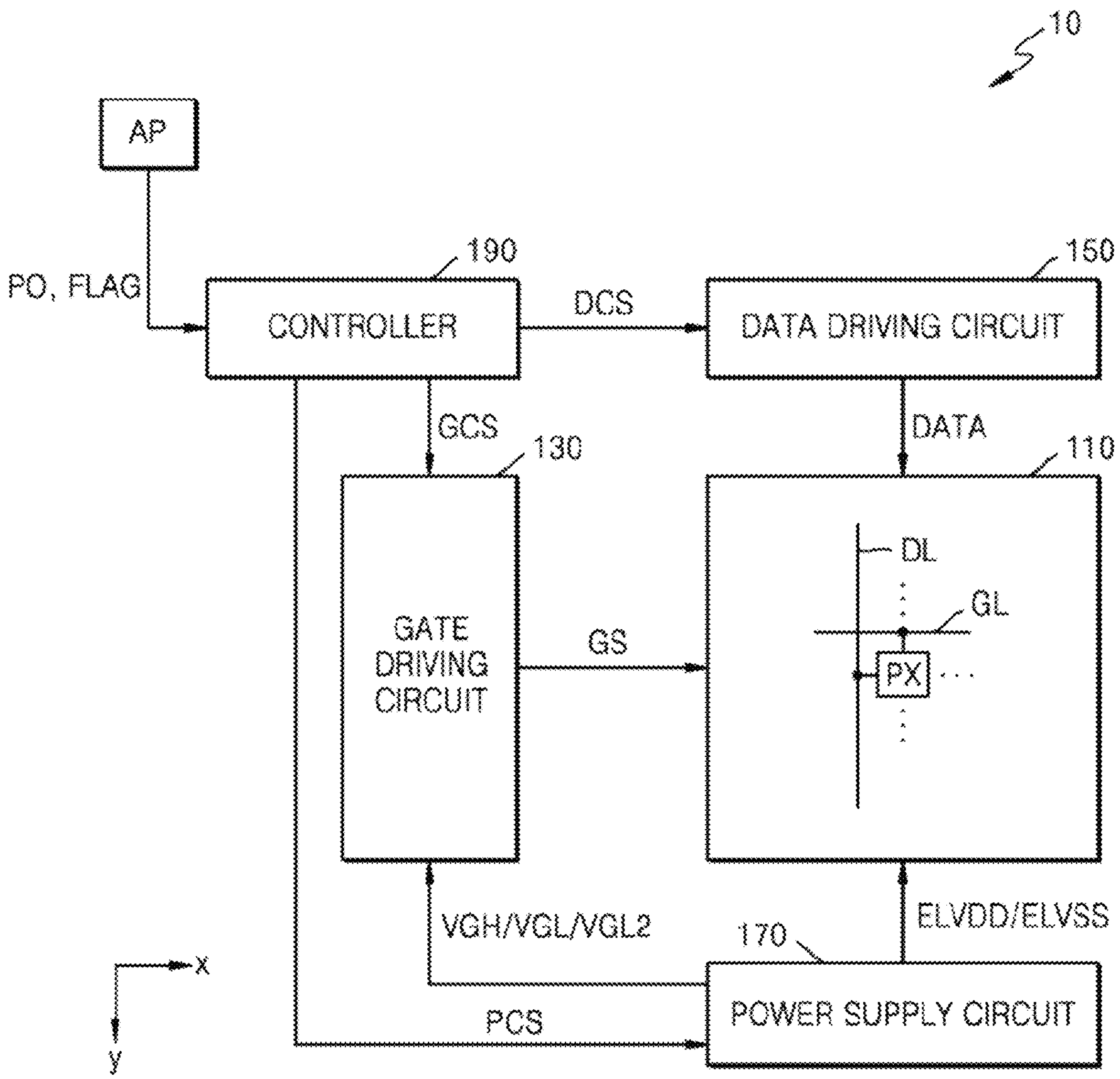
FIG. 14 is a diagram schematically illustrating a display device, according to an embodiment.

FIG. 14 is a diagram schematically illustrating a display device, according to an embodiment;

A display device 10 is a device for displaying a moving image or a still image and may visually provide information to a user. The display device 10 according to an embodiment may be a display device such as an organic light-emitting display device, an inorganic light-emitting display device (or an inorganic electroluminescent (EL) display device), or a quantum dot light-emitting display device.

Referring to FIG. 14, the display device 10 according to an embodiment may include a display panel 110. The display panel 110 may include a liquid crystal display panel, an organic light-emitting display panel, or an inorganic light-emitting display panel, but a type of the display panel 110 is not limited thereto. The display panel 110 may be of a rigid type or a flexible type that may be rolled or folded.

A plurality of gate lines GL, a plurality of data lines DL, and a plurality of pixels PX connected to the gate lines GL and the data lines DL may be located on the display panel 110. An area where the plurality of pixels PX are located may correspond to a display area where an image is displayed.

The plurality of pixels PX may be repeatedly arranged in a first direction (an x-direction or a row direction) and a second direction (a y-direction or a column direction). The plurality of pixels PX may be arranged in any of various forms, such as a stripe arrangement, a PENTILE® arrangement, a diamond arrangement, or a mosaic arrangement, to display an image. Each of the plurality of pixels PX may include an organic light-emitting diode as a display element, and the organic light-emitting diode may be connected to a pixel circuit. The pixel circuit may include a plurality of transistors and at least one capacitor. Each pixel PX may emit light, for example, red light, green light, blue light, or white light, through the organic light-emitting diode (OLED). Each pixel PX may be connected to a corresponding gate line from among the plurality of gate lines GL and a corresponding data line from among the plurality of data lines DL.

In an embodiment, the plurality of transistors included in the pixel circuit may be P-channel silicon transistors. In an embodiment, the plurality of transistors included in the pixel circuit may be N-channel oxide transistors. In an embodiment, some of the plurality of transistors included in the pixel circuit may be P-channel silicon transistors and others may be N-channel oxide transistors.

Each of the gate lines GL may extend in the x-direction (row direction) and may be connected to the pixels PX located in the same row. Each of the gate lines GL may transmit gate signal to the pixels PX in the same row. Each of the data lines DL may extend in the y-direction (column direction) and may be connected to the pixels PX located in the same column. Each of the data lines DL may transmit a data signal to each of the pixels PX in the same column in synchronization with a gate signal.

In a peripheral area (e.g., a non-display area) outside the display area of the display panel 110, various conductive lines for transmitting an electrical signal to be applied to the display area, outer driving circuits electrically connected to pixel circuits, and pads to which a printed circuit board or a driver integrated circuit (IC) chip is attached may be located. For example, in the peripheral area of the display panel 110, a gate driving circuit 130, a data driving circuit 150, a power supply circuit 170, and a controller 190 may be provided.

The gate driving circuit 130 may be connected to the plurality of gate lines GL, may generate gate signals GS in response to a gate driving control signal GCS from the controller 190, and may sequentially supply the gate signals GS to the gate lines GL. The gate line GL may be connected to a gate of a transistor included in the pixel PX, and the gate signal GS may be a gate control signal for controlling turn-on and turn-off of the transistor to which the gate line is connected. The gate signal GS may include a gate-on voltage for turning on a transistor and a gate-off voltage for tuning off the transistor. The gate driving circuit 130 may include a plurality of stages for sequentially generating and outputting the gate signals GS.

In an embodiment, the gate driving circuit 130 may be implemented as the driving circuit DRV of FIG. 1. For example, the gate signal GS output by the gate driving circuit 130 to each gate line GL may correspond to the output signal OUT of a high level output to an output line by each of the plurality of stages (e.g., ST1 to STn). Each of the plurality of stages (e.g., ST1 to STn) may be connected to the gate line GL located in a corresponding row of the display panel 110. Each of the plurality of stages (e.g., ST1 to STn) may generate the gate signal GS as the output signal OUT and may output the gate signal GS to the gate line GL connected thereto. That is, each of the first to $n^{th}$ stages ST1 to STn may supply the gate signal GS of a high level to the gate line GL provided in a corresponding row. In an embodiment, each of the first to $n^{th}$ stages ST1 to STn of the gate driving circuit 130 may be the stage ST described with reference to FIGS. 3 to 13.

The number of stages constituting the gate driving circuit 130 according to an embodiment may change in various ways according to the number of rows (horizontal lines) provided on the display panel 110.

The data driving circuit 150 may be connected to the plurality of data lines DL and may supply a data signal DATA to the data lines DL in response to a data driving control signal DCS from the controller 190. The data signal DATA input to the data lines DL may be input to the pixels PX to which the gate signal is input. The data driving circuit 150 may convert input image data having a gray level input from the controller 190 into the data signal DATA in the form of a voltage or current.

The power supply circuit 170 may generate signals (voltages and current) required to drive the pixels PX in response to a power driving control signal PCS from the controller 190. The power supply circuit 170 may supply power to elements of an electronic device. The power supply circuit 170 may include a power management integrated circuit (PMIC). The PMIC may supply optimized power to each of the elements of the electronic device.

When the display device 10 is an organic light-emitting display device, the power supply circuit 170 may generate a first power supply voltage ELVDD and a second power supply voltage ELVSS and may supply the first power supply voltage ELVDD and the second power supply voltage ELVSS to the pixels PX. The first power supply voltage ELVDD may be a high-level voltage provided to one terminal of a driving transistor connected to a first electrode (a pixel electrode or an anode) of the organic light-emitting diode of each pixel PX. The second power supply voltage ELVSS may be a low-level voltage provided to a second electrode (a counter electrode or a cathode) of the organic light-emitting diode. The first power supply voltage ELVDD and the second power supply voltage ELVSS may be driving voltages for causing the plurality of pixels PX to emit light.

The power supply circuit 170 may generate a first voltage VGH, a second voltage VGL, and a third voltage VGL2 and may supply the first voltage VGH, the second voltage VGL, and the third voltage VGL2 to the gate driving circuit 130.

The controller 190 may generate the gate driving control signal GCS, the data driving control signal DCS, and the power driving control signal PCS based on signals input from the outside. The controller 190 may supply the gate driving control signal GCS to the gate driving circuit 130, may supply the data driving control signal DCS to the data driving circuit 150, and may supply the power driving control signal PCS to the power supply circuit 170.

In an embodiment, the gate driving control signal GCS may include the reset signal ESR, the external start signal FLM and a plurality of clock signals (e.g., CLK1 and CLK2). Before voltages such as the first voltage VGH, the second voltage VGL, and the third voltage VGL2 are stably operated through the power supply circuit 170, the reset signal ESR may be supplied to the gate driving circuit 130 by the controller 190, thereby enabling the display device to stably operate. The controller 190 may independently control timings at which the first reset signal ESR1 and the second reset signal ESR2 are output.

In an embodiment, the display device 10 may be connected to a processor of the electronic device. The processor may include an application processor AP. The controller 190 may receive an on-operation signal, for example, a power-on signal PO and/or an operation flag signal FLAG, from the application processor AP. When the electronic device is powered on or awakened from a sleep mode by the user, the controller 190 may receive an on-operation signal from the application processor AP, and based on this signal, generate and output the gate driving control signal GCS, the data driving control signal DCS, and the power driving control signal PCS. The gate driving circuit 130 receiving the gate driving control signal GCS may operate at a timing according to an embodiment described above.

While the display device 10 of FIG. 14 is illustrated as including the power supply circuit 170 independent of the controller 190, the disclosure is not limited thereto. In an embodiment, the power supply circuit 170 may be included in the controller 190.

In an embodiment, the gate driving circuit 130, the data driving circuit 150, the power supply circuit 170, and the controller 190 may be mounted as driving chips on the display panel 110. The data driving circuit 150, the power supply circuit 170, and the controller 190 may be formed as separate integrated circuit chips or may be formed as one integrated circuit chip and may be located on a flexible printed circuit board (FPCB) electrically connected to a pad located on a side of a substrate constituting the display panel 110. In another embodiment, the data driving circuit 150, the power supply circuit 170, and the controller 190 may be directly located on the substrate in a chip-on-glass (COG) or chip-on-plastic (COP) manner.

In an embodiment, a part or the whole of the gate driving circuit 130 may be directly formed in a peripheral area of the substrate during a process of forming a transistor constituting a pixel circuit in a display area of the substrate. The gate driving circuit 130 may include an amorphous silicon thin-film transistor (TFT) gate driver circuit (ASG), a low-temperature polycrystalline silicon (LTPS) TFT gate driver circuit, or an oxide semiconductor TFT gate driver circuit (OSG) built in the display panel 110.

FIGS. 15 to 17B are perspective views schematically illustrating a display device, according to an embodiment.

Figure 15:
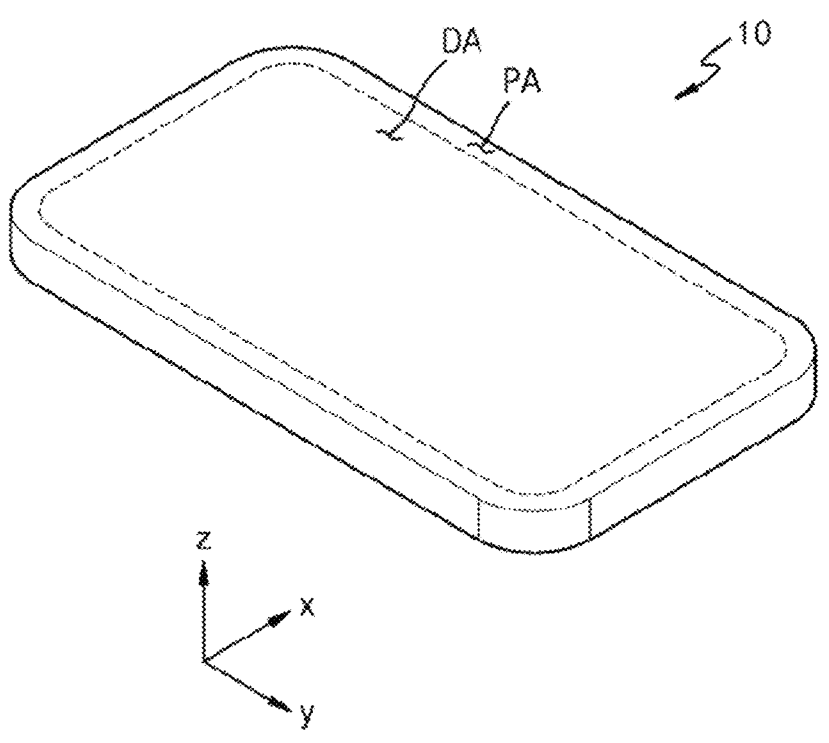
FIGS. 15, 16A, 16B, 17A and 17B are perspective views schematically illustrating a display device, according to an embodiment.

The display device 10 according to an embodiment may be rigid without flexibility and may be entirely flat, as shown in FIG. 15.

The display device 10 may include a display area DA where an image is displayed and a peripheral area PA outside the display area DA. The display area DA may be entirely surrounded by the peripheral area PA. In a plan view, the display area DA may have a rectangular shape. In another embodiment, the display area DA may have a polygonal shape (e.g., a triangular shape, a pentagonal shape, or a hexagonal shape), a circular shape, an elliptical shape, or an irregular shape. The display area DA may have a shape with rounded corners.

Figure 16A:
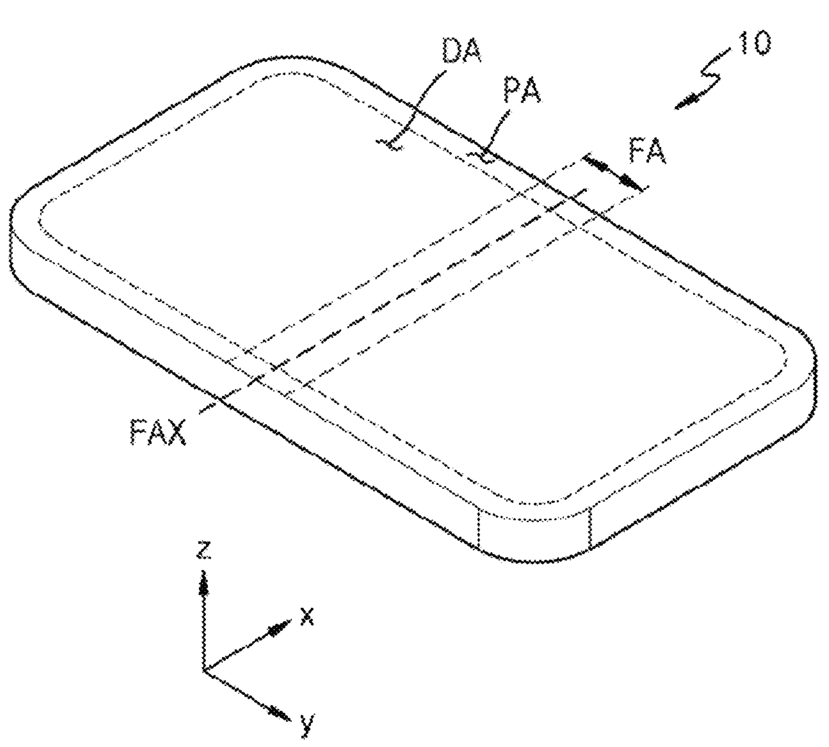
Figure 17A:
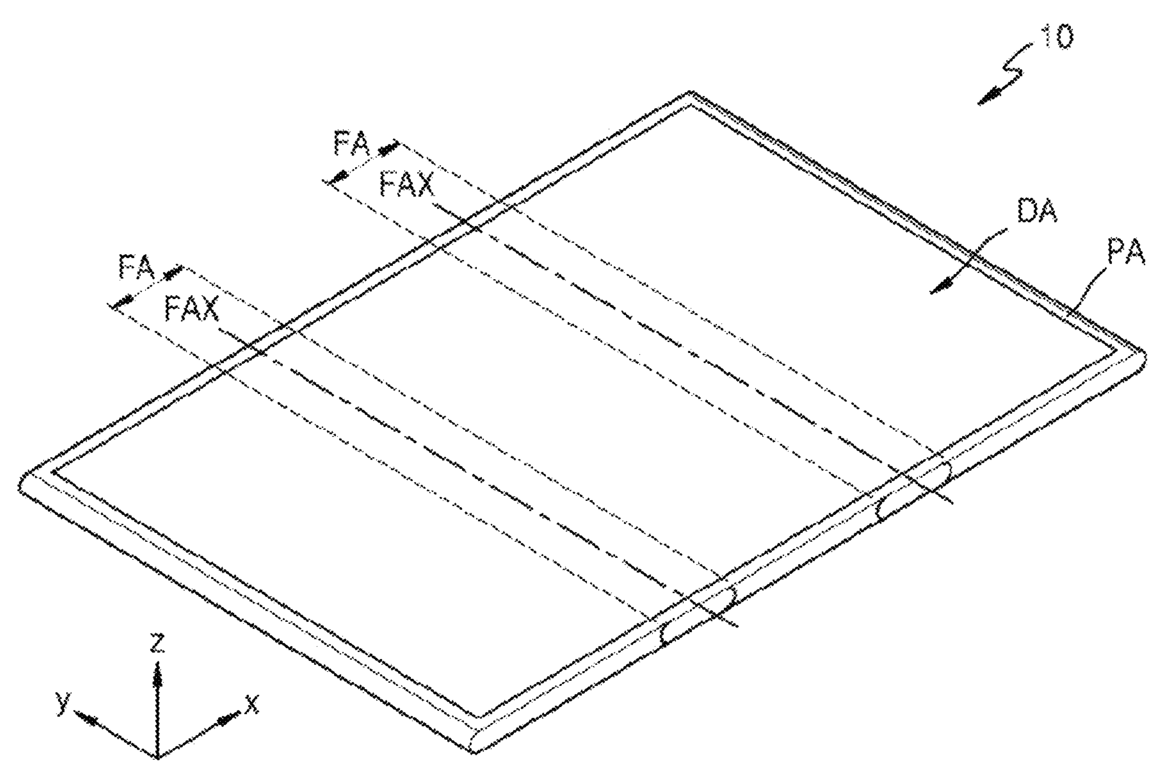

In an embodiment, the display device 10 may include the display area DA having a shape in which a length in a y-direction is greater than a length in an x-direction as shown in FIGS. 15 and 16A. In another embodiment, the display device 10 may include the display area DA having a shape in which a length in the x-direction is greater than a length in the y-direction as shown in FIG. 17A. The z-direction may be substantially perpendicular to the plane defined by the x-direction and the y-direction.

The display device 10 according to an embodiment may be folded or bent, as shown in FIGS. 16A to 17B. In an embodiment, the display device 10 may be folded so that display surfaces face each other. In another embodiment, the display apparatus 10 may be folded so that a display surface faces outward. The term "folded" means that a shape is not fixed but may be changed into another shape from an original shape, and may include being folded, curved, or rolled along at least one specific line, i.e., a folding axis.

Figure 16B:
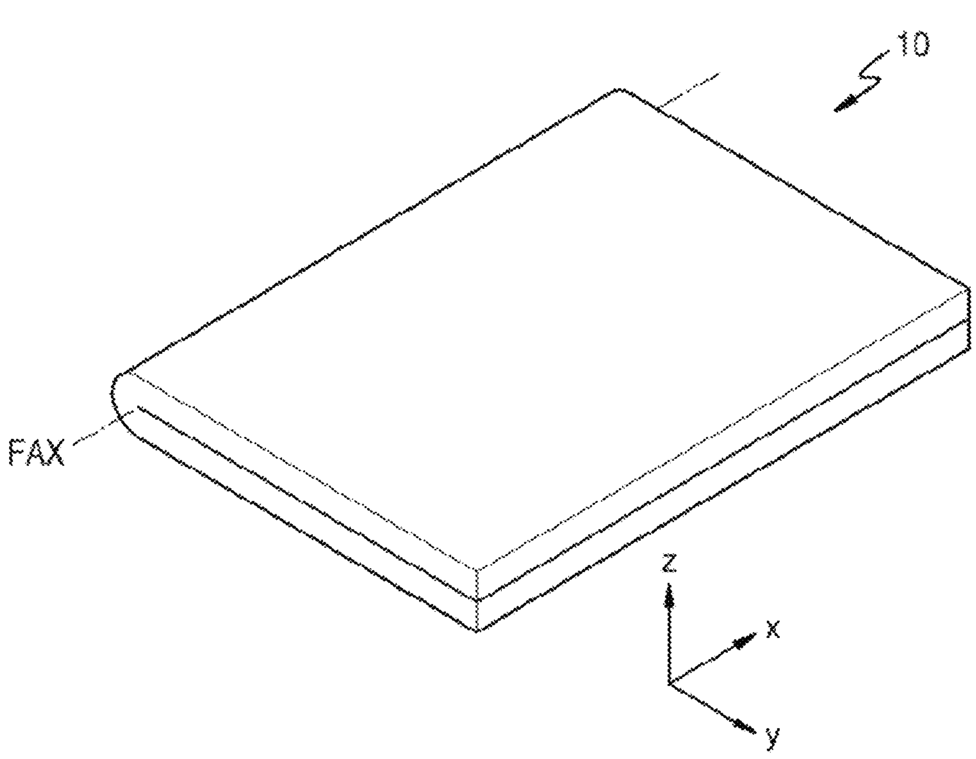
Figure 17B:
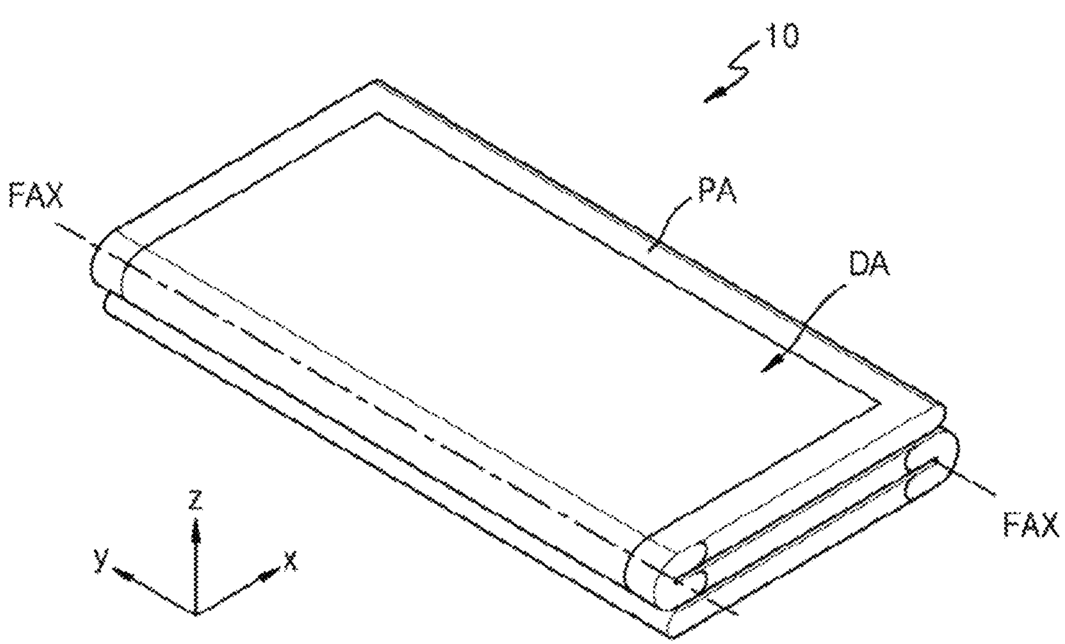

As shown in FIGS. 16A and 17A, the display area DA may include at least one folding area that is flexible and foldable. As shown in FIGS. 16B and 17B, the folding area FA may be folded along a folding axis FAX.

Each stage of a driving circuit according to an embodiment may include a reset circuit (e.g., The reset circuit 137*a* of FIG. 3, the reset circuit 137*b* of FIG. 7, the reset circuit 137*c* of FIG. 10 and the reset circuit 137*d* of FIG. 12) for simultaneously resetting a plurality of stages before an operation for outputting an output signal. Accordingly, a flash due to an abnormal power-on/off sequence may be prevented. In particular, when folding/unfolding of the flexible display device as shown in FIGS. 16A and 17A is performed quickly, a flash due to an abnormal power-on/off sequence may be prevented. For example, unwanted visual effects such as a brief flash of light on the display panel may be presented.

An electronic device according to an embodiment may output various information through the display device 10 under control of an operating system. When a processor executes an application stored in a memory, the display device 10 may provide application information to a user through a display panel.

The display device 10 may be used as a display screen of not only a portable electronic device, such as a mobile phone, a smartphone, a tablet personal computer (PC), a mobile communication terminal, an electronic notebook, an e-book, a portable multimedia player (PMP), a navigation system, or an ultra-mobile PC (UMPC), but also any of various products, such as a television, a computer device, a laptop, a monitor, a billboard, or the Internet of things (IoT) device. Also, the display device 10 according to an embodiment may be used in a wearable device such as a smart watch, a watch phone, a glasses-type display, or a head-mounted display (HMD). Also, the display device 10 according to an embodiment may be used as a center information display (CID) located on an instrument panel, a center fascia, or a dashboard of a vehicle, a room mirror display replacing a side-view mirror of a vehicle, or a display located on the back of a front seat for entertainment for a back seat passenger of a vehicle.

The electronic device of the disclosure may be any of various devices. The electronic device may include at least one of a portable communication device (e.g., a smartphone), a computer device, a portable multimedia device, a portable medical device, a camera, a wearable device, and a home appliance. The electronic device according to an embodiment is not limited to the above devices.

According to an embodiment, there may be provided a driving circuit capable of outputting a gate signal with low power and stably and a display device including the driving circuit.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A driving circuit comprising a plurality of stages, wherein each of the plurality of stages comprises:

a first transistor connected to a first terminal receiving a start signal, and to a first node, the first transistor comprising a gate connected to a clock terminal receiving a clock signal;

a second transistor connected between the first node and a second node, and comprising a gate connected to a second terminal receiving a first voltage;

a third transistor connected between a third terminal receiving a second voltage higher than the first voltage, and a third node QB, the third transistor comprising a gate connected to the first node;

a fourth transistor connected between the third node and the second terminal, and comprising a gate connected to the second node;

a fifth transistor connected between an output terminal and the second terminal, and comprising a gate connected to the second node;

a sixth transistor connected between the third terminal and the output terminal, and comprising a gate connected to the third node; and a seventh transistor connected between the third node and the second terminal, and comprising a gate connected to a reset terminal, wherein each of the plurality of stages further comprises an eighth transistor connected between the third terminal and the first node, and comprising a gate connected to a second reset terminal, wherein the seventh transistor is a P-channel transistor and the eighth transistor is an N-channel transistor, wherein a timing at which a first reset signal input to the reset terminal connected to the seventh transistor is a gate-on voltage and a timing at which a second reset signal input to the second reset terminal connected to the eighth transistor is the gate-on voltage are the same.

2. The driving circuit of claim 1, wherein, from a time when the first voltage and the second voltage are input to a time when the clock signal is input, a reset signal of a gate-on voltage is input to the reset terminal of each of the plurality of stages, and the third nodes of the plurality of stages are simultaneously reset to the first voltage.

3. The driving circuit of claim 2, wherein, for a certain period of time before the time when the first voltage and the second voltage are input, 0 volts (V) is input to the first terminal, the second terminal, the third terminal, and the reset terminal of each of the plurality of stages, and the third nodes of the plurality of stages are simultaneously discharged to 0 V.

4. The driving circuit of claim 2, wherein, when the start signal is input after the time when the clock signal is input, output signals are sequentially output from the output terminals of the plurality of stages, and a reset signal of a gate-off voltage is input to the reset terminal of each of the plurality of stages from the time when the clock signal is input.

5. The driving circuit of claim 1, wherein the third transistor is a P-channel transistor, and the fourth transistor is an N-channel transistor.

6. The driving circuit of claim 1, wherein the fourth transistor is an N-channel transistor, and remaining transistors other than the fourth transistor and the eighth transistor are P-channel transistors.

7. The driving circuit of claim 1, wherein each of the plurality of stages further comprises:

a first capacitor connected between the second node and the output terminal; and a second capacitor connected between the third terminal and the third node.

8. A driving circuit comprising a plurality of stages, wherein each of the plurality of stages comprises:

a first transistor connected to a first terminal receiving a start signal, and to a first node, the first transistor comprising a gate connected to a clock terminal receiving a clock signal;

a second transistor connected between the first node and a second node, and comprising a gate connected to a second terminal receiving a first voltage;

a third transistor connected between a third terminal receiving a second voltage higher than the first voltage, and a third node, the third transistor comprising a gate connected to the first node;

a fourth transistor connected between the third node and the second terminal, and comprising a gate connected to the second node;

a fifth transistor connected between an output terminal and the second terminal, and comprising a gate connected to the second node;

a sixth transistor connected between the third terminal and the output terminal, and comprising a gate connected to the third node;

a seventh transistor connected between the third node and a fourth terminal receiving a third voltage lower than the first voltage, the seventh transistor comprising a gate connected to a reset terminal; and an eighth transistor connected between the third terminal and the first node, and comprising a gate connected to the reset terminal.

9. The driving circuit of claim 8, wherein the seventh transistor and the eighth transistor are N-channel transistors.

10. The driving circuit of claim 8, wherein, from a time when the first voltage, the second voltage, and the third voltage are input to a time when the clock signal is input, a reset signal of a gate-on voltage is input to the reset terminal of each of the plurality of stages, and the third nodes of the plurality of stages are simultaneously reset to the first voltage.

11. The driving circuit of claim 10, wherein, for a certain period of time before the time when the first voltage, the second voltage, and the third voltage are input, 0 volts (V) is input to the first terminal, the second terminal, the third terminal, and the reset terminal of each of the plurality of stages, and the third nodes of the plurality of stages are simultaneously discharged to 0 V.

12. The driving circuit of claim 10, wherein, when the start signal is input after the time when the clock signal is input, output signals are sequentially output from the output terminals of the plurality of stages, and a reset signal of a gate-off voltage is input to the reset terminal of each of the plurality of stages from the time when the clock signal is input.

13. The driving circuit of claim 8, wherein the third transistor is a P-channel transistor, and the fourth transistor is an N-channel transistor.

14. The driving circuit of claim 8, wherein each of the plurality of stages further comprises:

a first capacitor connected between the second node and the output terminal; and a second capacitor connected between the third terminal and the third node.

15. An electronic device comprising:

a controller configured to output a plurality of clock signals;

a power supply circuit configured to output a plurality of voltages; and a driving circuit configured to output a gate signal based on the plurality of clock signals and the plurality of voltages, wherein the driving circuit comprises a plurality of stages, wherein each of the plurality of stages comprises:

a first transistor connected to a first terminal receiving a start signal, and to a first node, the first transistor comprising a gate connected to a clock terminal receiving one of the clock signals;

a second transistor connected between the first node and a second node, and comprising a gate connected to a second terminal receiving a first voltage among the plurality of voltages;

an inverter connected between a third terminal receiving a second voltage among the plurality of voltages, and the second terminal, the inverter being configured to control a voltage of a third node to be a voltage obtained by inverting a voltage level of the first node or the second node;

a pull-down transistor connected between an output terminal and the second terminal, and comprising a gate connected to the second node;

a pull-up transistor connected between the third terminal and the output terminal, and comprising a gate connected to the third node; and a reset circuit configured to reset the second node or the third node, wherein the reset circuit comprises:

a third transistor connected between the third node and the second terminal, and comprising a gate connected to a first reset terminal; and a fourth transistor connected between the third terminal and the first node, and comprising a gate connected to a second reset terminal, wherein the third transistor is a P-channel transistor, and the fourth transistor is an N-channel transistor, wherein a timing at which a first reset signal input to the first reset terminal of the third transistor is a gate-on voltage and a timing at which a second reset signal input to the second reset terminal of the fourth transistor is a gate-on voltage are the same.

16. An electronic device comprising:

a controller configured to receive an on-operation signal from a processor and output a reset signal based on the on-operation signal; and a driving circuit comprising a stage configured to receive the reset signal and reset a control node, wherein the stage comprises:

a first transistor connected to a first terminal receiving a start signal, and to a first node, the first transistor comprising a gate connected to a clock terminal receiving a clock signal;

a second transistor connected between the first node and a second node, and comprising a gate connected to a second terminal receiving a first voltage;

an inverter connected between a third terminal receiving a second voltage, and the second terminal, the inverter being configured to control a voltage of the control node to be a voltage obtained by inverting a voltage level of the first node or the second node;

a pull-down transistor connected between an output terminal and the second terminal, and comprising a gate connected to the second node;

a pull-up transistor connected between the third terminal and the output terminal, and comprising a gate connected to the control node; and a reset transistor connected between the control node and the second terminal, and comprising a gate connected to a reset terminal receiving the reset signal, wherein the stage further comprises a second reset transistor connected between the third terminal and the first node, and comprising a gate connected to a second reset terminal, wherein the reset transistor is a P-channel transistor, and the second reset transistor is an N-channel transistor, wherein the controller is further configured to control a timing at which a reset signal input to the reset terminal of the reset transistor is a gate-on voltage and a timing at which a second reset signal input to the second reset terminal of the second reset transistor is a gate-on voltage to be the same.

* * * * *